United States Patent [19]

Lyon et al.

[11] Patent Number: 4,796,227
[45] Date of Patent: Jan. 3, 1989

[54] COMPUTER MEMORY SYSTEM

[75] Inventors: Richard F. Lyon, Los Altos; Richard R. Schediwy, Mountain View, both of Calif.

[73] Assignee: Schlumberger Systems and Services, Inc., Palo Alto, Calif.

[21] Appl. No.: 27,218

[22] Filed: Mar. 17, 1987

[51] Int. Cl.[4] .................... G11C 11/40; G11C 13/00
[52] U.S. Cl. ..................................... 365/154; 365/190
[58] Field of Search ............... 365/154, 189, 190, 202, 365/227

[56] References Cited

U.S. PATENT DOCUMENTS

| | | | |
|---|---|---|---|
| 3,703,710 | 11/1972 | Masaharu et al. | 365/190 |
| 4,120,047 | 10/1978 | Varadi | 365/227 |
| 4,442,509 | 4/1984 | Herndon | 365/154 |
| 4,554,644 | 11/1985 | Chen et al. | 365/226 |
| 4,604,729 | 8/1986 | Kimoto | 365/190 |

*Primary Examiner*—Terrell W. Fears
*Attorney, Agent, or Firm*—Fitch, Even, Tabin & Flannery

[57] ABSTRACT

An improved computer memory system based on a novel four transistor memory cell and an improved address decoder circuit is disclosed. The memory cell can be fabricated using currently available logic fabrication processes and requires a silicon area less than that required by prior art static memory cells. The improved decoder can be fabricated in significantly less silicon area than existing NOR gate decoder arrays and is faster than existing NOR gate decoder arrays.

16 Claims, 15 Drawing Sheets

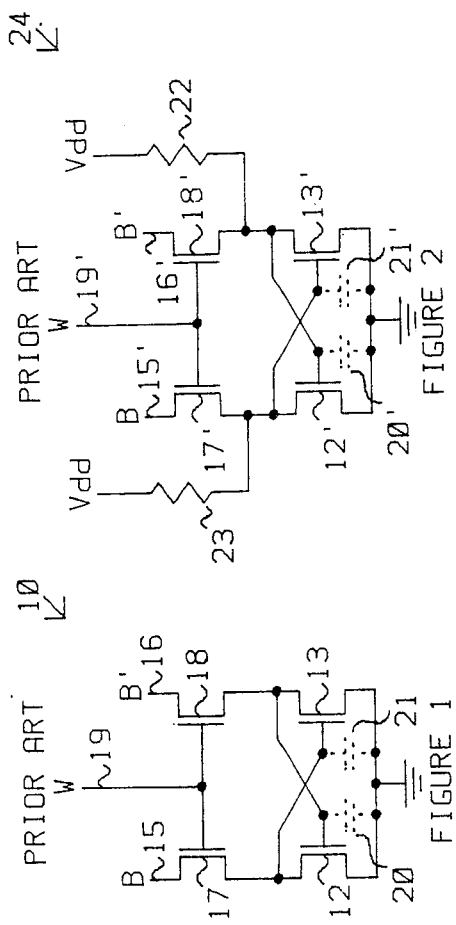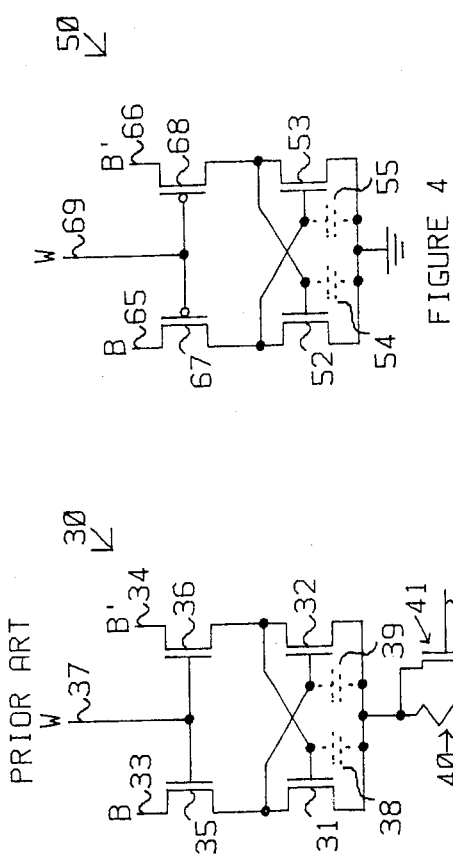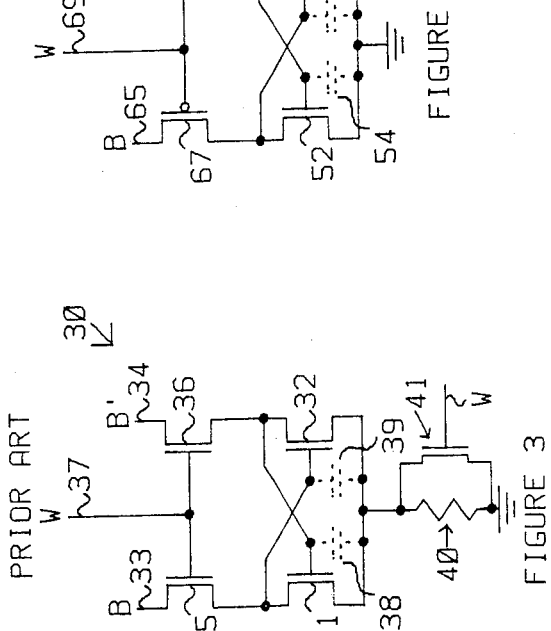

COMPUTER MEMORY SYSTEM

The present invention relates to semiconductor memory systems for use in computer systems and more particularly to an improved static memory cell and computer memory system based thereon.

The memories used in modern computing systems are generally constructed from one or more VLSI silicon chips consisting of hundreds of thousands of individual memory cells. Each such cell stores one bit of information. These memory cells are typically divided into two types, referred to as static and dynamic memory cells. A static memory cell will continue to store data for as long as power is applied to it. In contrast, a dynamic memory cell must be periodically refreshed or it losses the data stored in it.

The amount of silicon area needed to fabricate a memory cell depends on the type of memory cell and the type of fabrication process being used. In the more economical fabrication processes used for constructing logic chips, the dynamic memory cells require a smaller area of silicon to fabricate than do static memory cells. Since the area of silicon needed per memory cell determines the cost of the memory cell, dynamic memories are, in general, cheaper to produce than static memory cells. This accounts for the more wide spread use of dynamic cells in large memory systems.

If a static memory cell requiring a silicon area comparable to that required by a dynamic memory cell could be produced it would be preferred, since the additional circuitry and system complexity introduced by the need to periodically refresh the dynamic memory cells could be avoided. In addition, dynamic memory cells are usually more susceptible to errors resulting from electronic noise in the system or from noise resulting from bombardment by charged particles produced by cosmic rays or other radiation sources. Hence, in high speed data processing systems, static memory cells are preferred for their lower error rate. This is particularly important in large memory systems.

A second problem in prior art computer memories is the time needed to access a given memory cell or group of memory cells. Integrated circuit memory arrays usually include one or more address decoder circuits for converting a binary encoded address into a 1-of-N code. Typically, groups of memory cells are arranged in rows which are referred to as "words". Each word may be connected to a bus for reading and writing the data stored therein. The particular word which is so connected at any given time is specified by a signal on a "word line" associated with the word in question. The word line is, typically, coupled to the circuitry used to connect the word to the bus. The desired word line is usually specified in the computer by a binary coded address which specifies the location of the desired word relative to the beginning of the memory. This address must be decoded to provide a signal on precisely one of the word lines.

The simplest circuitry for accomplishing this decoding operation usually consists of an array of N NOR gates. Each NOR gate holds its output in the inactive state until a particular bit pattern associated with that NOR gate is detected. This simple approach is only practical in small memories. In larger memories, the time needed to propagate a signal through the NOR gate array becomes the limiting factor in accessing the data stored in the memory. Furthermore, such arrays have two additional problems. They require large areas of silicon to construct, and they dissipate a significant amount of power. As a result, large memory system are required to use more complex dynamic decoding circuitry.

Broadly, it is an object of the present invention to provide an improved computer memory.

It is another object of the present invention to provide a static memory cell which can be fabricated using currently available logic fabrication processes and which requires a silicon area less than that required by prior art ttatic memory cells.

It is yet another object of the present invention to provide a deoder circuit which can be fabricated in significantly less silicon area than existing NOR gate decoder arrays.

It is still another object of the present invention to provide a decoder circuit which is faster than existing NOR gate decoder arrays.

These and other objects of the present invention will become apparent to those skilled in the art from the following detailed description of the invention and the accompanying drawings.

BRIEF DESCRIPTION OF THE DRAWINGS

FIG. 1 is a schematic diagram of a prior art four transistor dynamic memory cell.

FIG. 2 is a schematic diagram of a prior art four transistor static memory cell.

FIG. 3 is a schematic diagram of another prior art four transistor memory cell.

FIG. 4 is a schematic diagram of a memory cell according to the present invention.

SUMMARY OF THE INVENTION

Figure 5:
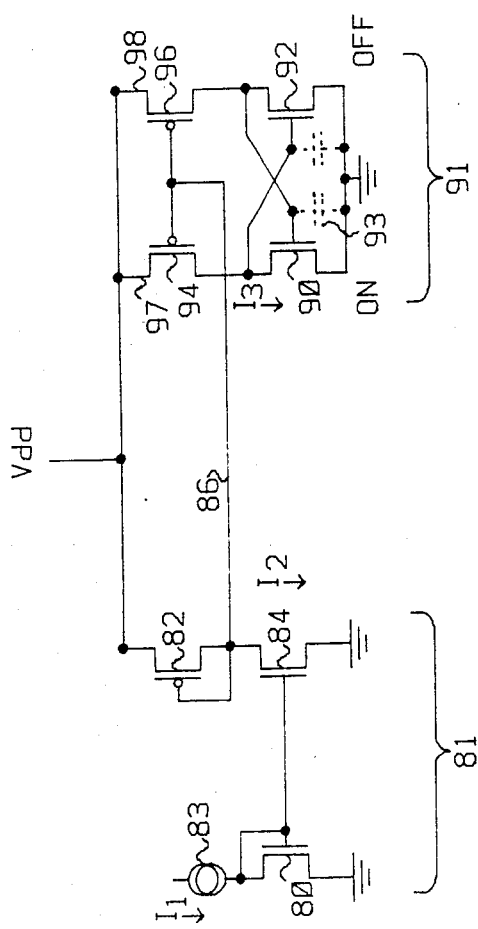
FIG. 5 illustrates a circuit which is electrically equivalent to a single memory cell connected to a bias circuit according to the present invention .

The present invention consists of an improved computer memory system based on a novel four transistor memory cell and an improved address decoder circuit. The four transistor memory cell has two states which are stored as potentials on the gates of first and second field effect transistors having a first channel type. The memory cell is powered by connecting said memory cell to two potentials. The sources of said first and second field effect transistors are connected to one of these potentials. The gate of said first field effect transistor is connected to the drain of said second field effect transistor. And, the gate of said second field effect transistor is connected to the drain of said first field effect transistor. In each of the stable states, a different one of said first and second field effect transistors is conductive. Third and fourth field effect transistors having channel types opposite to those of said first and second field effect transistors are used to bias said first and second field effect transistors. The third and fourth field effect transistors are also used as gates for reading and writing the state of said memory cell. The drain of said third field effect transistor is connected to the drain of said first field effect transistor. The drain of said fourth field effect transistor is connected to the drain of said second field effect transistor. The source of said third field effect transistor is coupled to a first read/write terminal. The source of said fourth field effect transistor is coupled to a second read-write terminal. Said first and second read-write terminals connect the memory cell to said second potential through the read-write circuitry used to power the memory cell. The gates of said third and fourth field effect transistors are coupled to a word select terminal. The memory cell is enabled for reading and writing by applying a word select potential to said word select terminal. When said memory cell is not so enabled, a bias potential is applied to said word select terminal. This bias potential is sufficient to cause said third and fourth field effect transistors to conduct a small current which assures that the state of the memory cell is maintained.

The present invention includes a driving circuit which provides the enabling and bias word select potentials. The driving circuit quickly drives the word line to the enabling potential during reading and writing operations and then returns the word line to the bias potential in a time which minimizes the power dissipation in the memory cell.

The improved decode circuit couples a first potential to the Kth decode node of an N decode node array, where K runs from 0 to N−1, and a second potential to the remaining ones of the N decode nodes. The decode circuit includes predecode circuitry for converting a binary coded address to an L-digit representation thereof, said L-digit representation being in a number system in which the Ith digit has a radix $R_I$. The radices are chosen such that N is the maximum number which may be represented by an L-digit number in said number system. The decode circuit also includes routing circuitry for coupling the decode node specified in said L-digit representation to a first power rail at said first potential, and pull-down circuitry for coupling all other nodes to a second power rail at said second potential.

The binary coded address is converted by the decode circuit of the present invention to an L digit representation thereof. The L digit representation consists of signals on L groups of predecode nodes, the Ith said group of predecode nodes comprising $R_I$ nodes. The predecode circuitry generates and couples a signal to one node in each said group of predecode nodes in response to said binary coded address. The predecode node to which said signal is coupled in the Ith group of predecode nodes is determined by the value of the Ith digit in the L digit representation of said binary coded address.

DETAILED DESCRIPTION OF THE INVENTION

1. Prior Art Memory Cells

The operation of the memory cell of the present invention can best be understood with reference to the prior art four transistor dynamic memory cell shown at 10 in FIG. 1. This dynamic memory cell consists of four field effect transistors, 12, 13, 17, and 18, of the same type. That is, they are either all p-channel field effect transistors or all n-channel field effect transistors. The memory cell 10 store one bit. The bit is stored in field effect transistors 12 and 13 which are cross-coupled to form a circuit having two stable states. The drain of field effect transistor 12 is connected to the gate of field effect transistor 13, and the drain of field effect transistor 13 is connected to the gate of field effect transistor 12. The sources of field effect transistors 12 and 13 are connected to the lowest power supply potential which, for n-channel field effect transistors, is typically ground. If p-channel field effect transistors are used, the sources of these field effect transistors are connected to the highest power supply potential.

Each state is characterized by having a different one of field effect transistors 12 and 13 conducting a current. If field effect transistor 12 is conducting, a high potential will be present on its gate and the memory cell will be defined to have a "1" stored in it. If field effect transistor 13 is conducting rather than a "0" is stored. The state of the memory cell is determined by measuring the current on line 15 or line 16 when field effect transistors 17 and 18 are placed in a conducting state by a potential applied to the word select line 19. Field effect transistors 17 and 18 are referred to as access transistors, since they are used both to sense the state of the memory cell and to change the state of the memory cell. This later operation will be referred to as writing the memory cell. Lines 15 and 16 are referred to as "bit lines", since they contain the state of the binary bit being read from, or written into, memory cell 10 when access transistors 17 and 18 are placed in a conducting state.

Field effect transistors 17 and 18 are connected in series with field effect transistors 12 and 13 such that the drain of field effect transistor 12 is connected to the source of field effect transistor 17, and the drain of field effect transistor 13 is connected to the source of field effect transistor 18. The state of the memory cell 10 may be changed by placing field effect transistors 17 and 18 in a conducting state and applying a potential to the drain of one of field effect transistors 17 or 18 while grounding the drain of the other one of field effect transistors 17 or 18.

When field effect transistors 17 and 18 are in a non-conducting state, the state of memory cell 10 is maintained by charge stored on the gates of the field effect transistors 12 and 13. The gates in question have finite parasitic capacitances which are indicated at 20 and 21 by capacitors drawn with dotted lines. These capacitances are sufficient to maintain the state of the memory cell for a short period of time when field effect transistors 17 and 18 are nonconducting. Each time field effect transistors 17 and 18 are placed in a conducting state, the capacitors 20 and 21 are recharged. When field effect transistors 17 and 18 are placed in the nonconducting state, the charge on these capacitors slowly leaks off. This leakage takes place from the gates or through the drains of field effect transistors 12 and 13. Hence, the memory cell 10 will maintain the appropriate state only if field effect transistors 17 and 18 are periodically placed in a conducting state. This need to refresh the charge on the capacitors 20 and 21 gives rise to the name "dynamic" memory cell, since the memory cell will only store a value if it is kept active by periodically refreshing the charge on the memory cell.

Dynamic memory cells have two significant disadvantages relative to static memory cells. First, additional circuitry is required to periodically refresh the charge on the capacitors 20 and 21. In addition to this added circuitry, the need to periodically refresh the charge places undesirable constraints on the organization of the computational system in which said memory cells are used, since the memory system must be taken out of srrvice periodically to refresh the memory cells.

Second, the sensitivity to noise, including that generated by secondary radiation resulting from cosmic rays or other radiation sources striking the memory cells is higher in dynamic memory cells. Charged particles or noise spikes on the various signal lines can change the charge on capacitors 20 and 21. This change in charge may result in a significant change in potential on the gates of the corresponding field effect transistors. The maximum change in potential which may be sustained without changing the state of the memory cell will depend on the difference between the potential on the capacitor when the noise event occurs and the minimum potential needed to maintain the state of the memory cell. When the memory cell has been recently refreshed, the memory cell is least affected by noise events. As the charge slowly leaks off the relevant capacitor, the sensitivity to noise increases.

The magnitude of the change in potential resulting from a noise event is inversely proportional to the capacitance of said capacitors. This capacitance also affects the time needed to read and write the memory cell. Memory cells having small capacitances wlll, in general, be capable of higher frequency operation than those with larger capacitances. Hence, dynamic memory cells designed to operate at high frequencies are, in general, more prone to noise generated errors.

The above mentioned problems could be overcome if the charge on capacitors 20 and 21 could be continually replenished by connecting these capacitors to a small current source. One prior art memory cell in which capacitors 20 and 21 are continually refreshed is illustrated in FIG. 2 at 24. Those functional elements in memory cell 24 which serve the same functions as the corresponding elements in memory cell 10 shown in FIG. 1 are numbered with like numbers with a prime added. Memory cell 24 differs from memory cell 10 only in that resistors 22 and 23, which are coupled to the appropriate the power rail, Vdd, are used to replenish the charge which leaks off of capacitors 20' and 21'.

Although memory cell 24 avoids the problems inherent in memory cell 10, new problems are introduced by the need to fabricate resistors 22 and 23. First, these resistors impose design toleranoes on the fabrication process which increase the cost of fabricating memory cell 24. Second, the resistors 22 and 23 increase require a more complex fabrication process which further increases the cost of memory cell 24 over memory cell 10.

A second prior art approach to recharging the gate capacitances as taught by Veradi (U.S. Pat. No. 4,120,047) is illustrated in FIG. 3 at 30. Memory cell 30 includes two cross-coupled field effect transistors 31 and 32 which form a circuit having two stable states for storing one bit of information. Field effect transistors 31 and 32 are coupled to bit lines 33 and 34 by field effect transistors 35 and 36 which couple field effect transistors 31 and 32 to their respective bit lines in response to a signal on a word line 37.

When memory cell 30 is not needed for reading and writing, it is taken out of service and field effect transistors 35 and 36 are turned on to replenish the charge on capacitors 38 and 39 which are shown in phantom. In this standby mode, field effect transistors 35 and 36 act as low impedance loads. That is, these transistors are switched "on" such that field effect transistors 31 and 32 are essentially coupled to their respective bit lines 33 and 34 by diodes. The current is regulated by the parallel combination of resistor 40 and field effect transistor 41. When the memory cell is to be read or written, transistor 41 is used to "short" resistor 40 to ground thereby increasing the current flow through the memory cell to a value consistent with reading and writing. This is accomplished by a signal applied to the gate of transistor 41. Since transistor 41 and resistor 40 may be shared by a number of memory cells, memory cell 30 requires essentially the same area of silicon as memory cell 10 shown in FIG. 1, while avoiding the problems inherent in memory cell 10.

However, memory cell 30 requires a significantly larger current than either memory cell 10 or memory cell 24. Memory cell 30 is equivalent to two crosscoupled inverters. The first inverter consists of field effect transistor 31 and field effect transistor 35, field effect transistor 35 acting as the "load resistor" of a switching transistor 31. The second inverter consists of field effect transistors 32 and field effect transistor 36 with field effect transistor 36 acting as the load resistor. A crosscoupled circuit of this type will only have two stable states if the gain of each of the inverters is greater than one. For this condition to be satisfied, the "transresistance" of the switching transistor (the gate voltage changed required to affect a unit change in source to drain current) when it is conducting must be less than the impedance of the "load resistor". In the case of memory cell 30, the "load resistors" are very small, since the "load resistors" in question, i.e., field effect transistors 35 and 36, are fully turned on field effect transistors. Hence, the inverter containing the switching transistor which is conducting, consists of a series combination of two field effect transistors, both of which being in the turned on state. Such a circuit only has sufficeint gain when the current supplied to it through resistor 40 is relatively high. Such high currents are undesireable.

2. Description of A Memory Cell According to the Present Invention

The memory cell of the present invention avoids these problems by continually replenishing the charge on capacitors 20 and 21 through bit line coupling transistors which are only partially turned on. Since the effective impedance of the bit line coupling transistors is much higher than that of the circuit taught by Veradi, the inverters can achieve a gain greater than one at a much lower current. In addition, the memory cell of the present invention does not require any circuit elements which are analogous to resistor 40 and shorting transistor 41 shown in FIG. 3.

A memory cell according to the present invention is shown in FIG. 4 at 50. It includes a pair of cross-coupled field effect transistors 52 and 53 comprising a circuit having two stable states. The selected state is maintained by charge stored on the gates of the field effect transistors 52 and 53. The gate capacitances used to store this charge are shown in phantom at 54 and 55. The state of the memory cell 50 is determined by measuring the current on bit line 65 or bit line 66 when field effect transistor 67 and field effect transistor 68 are placed in a conducting state by a potential applied to the word select line 69. Field effect transistors 67 and 68 are of an opposite type from field effect transistors 52 and 53. That is, if field effect transistors 52 and 53 are n-channel devices, then field effect transistors 67 and 68 must be p-channel devices, and vice versa. Hence, the drain of field effect transistor 52 is connected to the drain of field effect transistor 67. Similarly, the drain of field effect transistor 53 is connected to the drain of field effect transistor 68. The sources of field effect transistors 67 and 68 are connected to their respective bit lines 65 and 66. The advantages of this configuration will be explained in detail below.

When field effect transistors 67 and 68 are not being used to sense the status of field effect transistors 52 and 53, i.e., when they are not in a fully conducting state, a bias potential is applied to the word select line 69 which is sufficient to cause a small current to flow in field effect transistors 67 and 68. This current compensates for the leakage current through the gates of field effect transistors 52 and 53 which would otherwise result in a loss of charge by parasitic capacitors 54 and 55. Ideally, field effect transistors 67 and 68 act as constant current sources when they are not biased into their conducting state.

The current flowing through a field effect transistor when it is operated near its conduction threshold is a very sensitive function of the potential difference between the gate and source of said field effect transistor. The current in question is an exponential function of said potential difference. Hence, it is important that the potential between the gate and source of field effect transistors 67 and 68 be held at a constant value. As will be explained in detail below, this is not possible if field effect transistors 67 and 68 are of the same channel type as field effect transistors 52 and 53.

In prior art dynamic memory designs, the field effect transistors which are used to sense the state of the field effect transistors comprising the storage cell are of the same channel type as the field effect transistors making up the storage cell. Referring again to FIG. 1, field effect transistors 12, 13, 17, and 18 are all either p-channel devices, or are all n-channel devices. Since a current must flow through the series circuit comprised of field effect transistor 13 and field effect transistor 18 when the word line 19 is activated, field effect transistors 13 and 18 must be connected such that the source of field effect transistor 18 is connected to the drain of field effect transistor 13. Hence, the potential difference between the gate and source of field effect transistor 18 depends on the potential on at the drain of field effect transistor 13. One of the field effect transistors 12 and 13 will always be in a conducting state and the other in a nonconducting state. The identity of the conducting field effect transistor will depend on the data stored in the memory cell.

Consider the case in which field effect transistor 13 is in the conducting state, and field effect transistor 12 is nonconducting. The drain of field effect transistor 12 will be at a high potential and the drain of field effect transistor 13 will be at a low potential. The drain of field effect transistor 13 is connected to the source of field effect transistor 18, and the drain of field effect transistor 12 is connected to the source of field effect transistor 17. Hence, there will always be a significant difference in the currents flowing through field effect transistors 17 and 18. As a result, there is no potential value that, when applied to word line 19, will cause both field effect transistors 17 and 18 to conduct a current which is just sufficient to maintain the memory cell. If a potential is chosen to guarantee that the field effect transistor conducting the smallest current is properly biased, the other field effect transistor will conduct a large current which results in an unacceptable power usage. This problem is inherent in prior art dynamic memory cells, since there will always be a substantial difference between the gate to source potential in the field effect transistors connected to word line 19.

Referring again to FIG. 4, the memory cell of the present invention avoids this difference in gate to source potentials in the field effect transistors 67 and 68 by using field effect transistors of the opposite channel type from field effect transistors 52 and 53 which are used to store the state of the memory cell. For clarity, field effect transistors of one of the two possible channel types are shown with a small circle on the gate thereof. In order for a current to flow through the series combination of field effect transistor 68 and 53, these field effect transistors must be connected such that the drain of field effect transistor 53 is connected to the drain of field effect transistor 68. Similarly, the drain of field effect transistor 67 is connected to the drain of field effect transistor 52. The sources of field effect transistors 68 and 69 are connected to the bit sense lines 65 and 66 which are held at a constant potential when the cell is not being accessed for reading or writing. Hence, the potential difference between the gates of field effect transistors 67 and 68 and their respective sources is dependent only on the potential applied to word line 69. Thus, a constant potential difference may be maintained between bit lines 65 and 66 and the word line 69.

The bias potential which is applied to word line 69 is chosen so as to provide sufficient current to maintain the charges on capacitors 54 and 55 at the desired levels. This involves operating field effect transistors 67 and 68 in the subthreshold conductance region. In this region, MOS field effect transistors provide a saturation current which is an exponential function of the gate voltage over a range of currents from below one pico-ampere to approximately one micro ampere.

3. Word-Line Driving Circuit

The manner in which the bias current through field effect transistors 67 and 68 is controlled may be best understood by reference to FIG. 5. FIG. 5 illustrates a circuit which is electrically equivalent to a single memory cell 91 in "standby" mode connected to a bias circuit 81. When memory cell 91 is not being read or written, the bit lines 97 and 98 are coupled to the positive power supply Vdd through the read/write circuitry which will be discussed in detail below. For the purposes of the following discussion, it will be assumed that field effect transistor 90 in memory cell 91 is the field effect transistor which is in the conducting state.

The bias circuit 81 provides a bias potential on word line 86. This bias potential must turn on bus coupling field effect transistor 96 sufficiently to replenish any charge which leaks off of capacitor 95. Since field effect transistor 90 is assumed to be conducting, the potential difference across capacitor 93 is small. As a result, the charge on capacitor 93 is negligible and does not need to be replenished. Hence, the current, $I_3$ flowing through field effect transistor 94 which, in the ideal case, is equal to the current through bus coupling transistor 96, is wasted. However, since this current is very small, the overall power dissipation of the memory cell is not significantly effected.

The bias current, $I_3$, is set with the aid of two "current mirror" circuits. The combination of bias field effect transistor 82 and bus coupling field effect transistor 94 forms a current mirror in which the load current $I_3$ is proportional to the current $I_2$ in the bias circuit times a geometric width ratio which is proportional to the ratio of the widths of the channels of field effect transistors 82 and 94. The field effect transistor 80, together with bias field effect transistor 84, forms a second current mirror in which the current $I_2$ is proportional the current $I_1$ from the constant current source 83 times a second geometric width ratio which is proportional to the ratio of the widths of the channels of field effect transistors 80 and 84. Hence, the current $I_3$ which replenishes the charge on the memory cell 91 is proportional to the current $I_1$ from constant current source 83. By adjusting the various channel widths, $I_3$ currents as low as 1 pA (pico-ampere) may be regulated by adjusting the output of constant current source 83. As will be explained below, a single constant current source 83 may be used to control the bias voltages on all of the memory cells in a memory based on the present invention.

A bias current of between 10 pA and 10 nA has been shown to be sufficient to maintain static operation in a memory cell 91. In order for the currents to be predictable, the behavior of each memory cell in a large array must be uniform. However, there is sufficient margin for error in this regard to accommodate the expected variations in currently available fabrication methods. In currently available fabrication techniques, the threshold voltage of a field effect transistor at one point on a chip may vary by 100 mV from the threshold voltage of a field effect transistor at another location on the same chip. A change in the effective threshold voltage of a bus coupling field effect transistor of 100 mV is expected to increase or decrease the bias current by a factor of 10. Hence, at worst, the power dissipation of a large memory would be about 10 times more than the theoretical minimum power dissipation. This can easily be tolerated, since the minimum bias current needed to replace charge leakage is several orders of magnitude less than the high current limit dictated by power consumption considerations.

Figure 6:
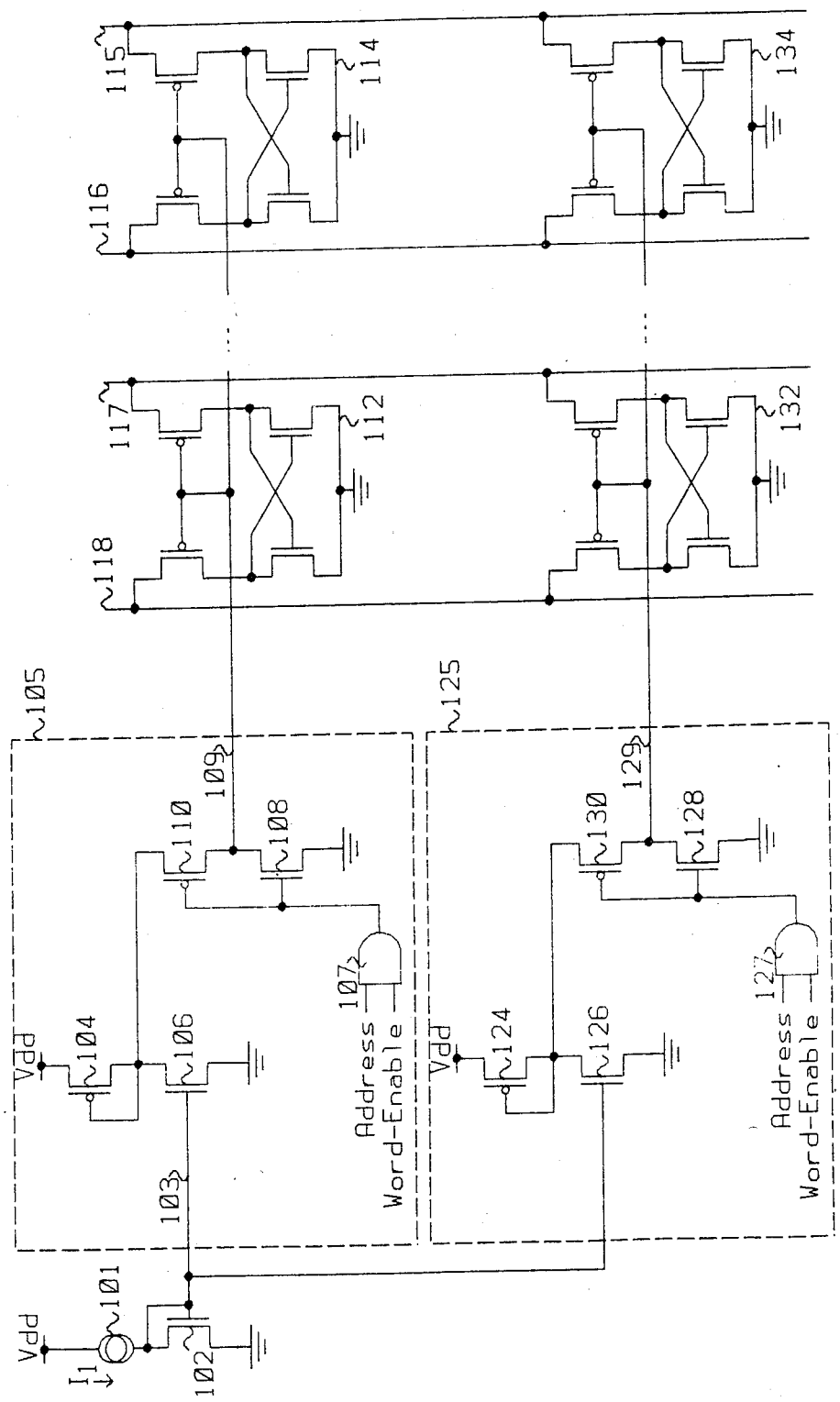
FIG. 6 illustrates the memory cells and word line biasing circuitry for a small memory having two words constructed from memory cells according to the present invention.

The bias circuit shown in FIG. 5 provides the appropriate bias potential to the memory cell 91 when the memory cell is not selected for reading or writing. When the memory cell is selected for reading and writing, the word line 86 must be driven low so that field effect transistors 90 and 92 are coupled to bits lines 97 and 98 respectively. Hence, in a memory based on the present invention, bias circuit 81 must be modified to include a switching means responsive to memory addressing circuitry for connecting the word line either to the bias potential generated by the bias circuit or to ground. A switched bias circuit for accomplishing this is shown in FIG. 6. FIG. 6 illustrates the memory cells and word line biasing circuitry for a small memory having two words constructed from memory cells according to the present invention.

Referring to FIG. 6, each word consists of a plurality of memory cells coupled to a common word line. The first word is coupled to word line 109 and consists of a plurality of memory cells of which 112 and 114 are typical. Each memory cell stores one bit of the data word in question. Similarly, the second word consists of a purality of memory cells of which 132 and 134 are typical, the memory cells in question being coupled to a second word line 129.

The memory cells used to store a particular bit in each of the data words are connected in parallel to a common pair of bit lines. For example, memory cells 112 and 132, which store the first bit of each data word, are coupled to bit lines 117 and 118. Similarly memory cells 114 and 134, which store the last bit of each data word, are coupled to bit lines 115 and 116. At any given time, at most one of the memory cells coupled to a particular pair of bit lines is selected for coupling to said bit lines. This is accomplished by bringing the potential on the word line coupled to said memory cells low. The remaining memory cells are held in a standby condition by applying the above discussed bias potential on the word lines connected to said memory cells.

The data in a memory cell which is in the standby mode is either maintained by a current flowing from the bit lines through the corresponding bus coupling transistors or by the capacitively stored charges on the gates of the corresponding cross-coupled field effect transistors in the memory cell. When the potential on the bit lines is at Vdd, the bias current maintains the state of the memory cell. During writing operations, one of the bit lines will be low. When the bit lines are low, the capacitively stored charge maintains the state of the memory cell. Hence, a memory cell according to the present invention actually combines the data retention techniques used in both static memory cells and dynamic memory cells.

Each of the word lines, 109 and 129, is coupled to a corresponding bias circuit, 105 and 125, respectively. Each of the bias circuits consists of two circuits. The first circuit is a switch for connecting the word line connected to said bias circuit between the above discussed bias potential and ground. The second circuit generates the bias potential in question in response to a current $I_1$ from a constant current source 101. Constant current source 101 and its associated diode connected field effect transistor 102 are shared by all of the bias circuits in the memory.

For example, bias circuit 105 consists of a switch formed from field effect transistors 110 and 108. The state of said switch is determined by the output of AND gate 107 which responds to the coincidence of an address signal and a word enable signal. The functions of the address and word enable signals will be discussed in more detail below. The bias potential for this switch is generated by field effect transistors 104 and 106. Here, field effect transistor 106 and field effect transistor 102 form a circuit analogous to the second current mirror discussed with reference to FIG. 5.

Similarly, bias circuit 125 consists of a switch formed from field effect transistors 130 and 128. The state of said switch is determined by the output of AND gate 127 which responds to the coincidence of a second address signal and said word enable signal. The bias potential for this switch is generated by field effect transistors 124 and 126. Here, field effect transistor 126 and field effect transistor 102 form a circuit analogous to the second current mirror discussed with reference to FIG. 5.

The word line driving circuitry is of key importance in determining the overall performance of a memory according to the present invention. The word line driver is responsible for two voltage transitions. The word line driver must quickly drive a word line to ground during reading and writing operations, and then return the word line to the bias voltage. If the word line driver is too slow in driving the word line to ground, the memory's response time will be too slow. If the word line river is too slow in returning the word line to the bias potential, the power dissipation of the memory will be increased. When a word line is driven low, or has not yet settled to its bias voltage, the memory cells connected to that word line may draw several orders of magnitude more current than the same memory cells connected to a word line which has settled at the correct bias potential. Although these higher currents do not disturb the state of the memory cell, the currents in question may be the determining factor in the overall power dissipation of a memory according to the present invention. Hence, returning the word line to the bias potential as quickly as possible is desirable.

Figure 7:
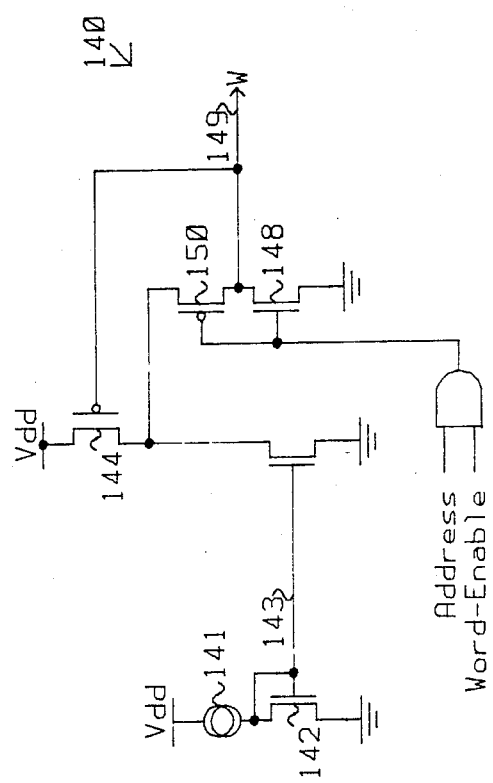
FIG. 7 is a schematic diagram of an improved word line bias circuit.

The idealized operation of the current mirrors discussed above with reference to FIG. 5 assumes that the word lines have settled to the bias voltage and that the bit lines have settled to Vdd. Although these assumptions are valid for the transition from the bias potential to ground, they are not true for the reverse transtion from ground to the bias potential. As a result, the bias circuit discussed above may result in power being wasted. An improved bias circuit is illustrated in FIG. 7 at 140.

Bias circuit 140 differs from bias circuits 81 shown in FIG. 5 in that diode connected field effect transistor 104 has been replaced by a pseudo-diode connected field effect transistor 144. The remaining field effect transistors serve functions analogous to the functions discussed with reference to bias circuit 81 shown in FIG. 5. A reference potential is generated on line 143 by a diode connected field effect transistor 142 which is connected to a constant current source 141. Word line 149 is connected to ground or the bias potential depending on the state of a switch consisting of field effect transistors 150 and 148. The switch in question being controlled by the coincidence of an address and word enable signal.

Figure 8:
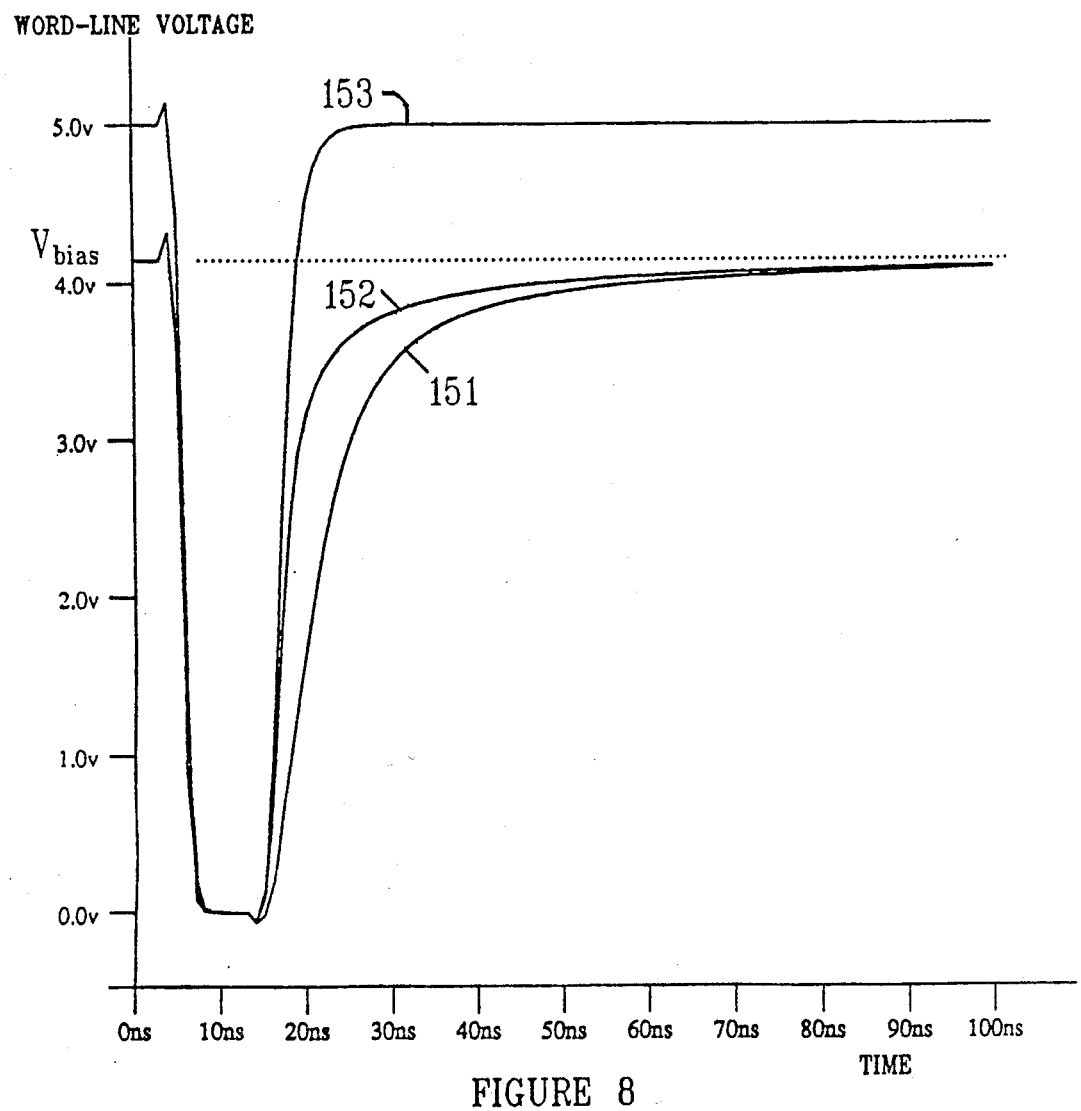
FIG. 8 illustrates the improvement in the time needed to return the word line to the bias potential using the improved bias circuit shown in FIG. 7.

FIG. 8 illustrates the improvement in the time needed to return the word line to the bias potential which is obtaiyned with bias circuit 140. Curve 152 in FIG. 8 is a plot of the word line potential on word line 149 shown in FIG. 7. Curve 151 is a plot of the potential on the corresponding word line in a driver circuit such as driver circuit 105 shown in FIG. 6. Both curves eventually settle to the bias potential, $V_{bias}$; however, curve 152 does so significantly faster. The superior performance of driver circuit 140 shown in FIG. 7 results from the use of the added voltage drop across field effect transistor 150 to turn on bias field effect transistor 144 harder while current is flowing. Once word line 149 settles to the bias potential, this voltage drop approaches zero, and the bias field effect transistor 144 becomes effectively diode-connected.

Curve 153 in FIG. 8 shows the word line potential that would result if bias field effect transistor 144 were suddenly connected to Vdd instead of being connected as a diode. It represents an ideal limit. That is, it measures the shortest time in which the word line could possible be made to settle given the geometric parameters of the field effect transistors in question. As can be seen from FIG. 8, the improved driver circuit 140 approaches the speed of the ideal limit, yet allows the word line to settle at the threshold voltage.

4. Reading a Memory Cell According to the Present Invention

Figure 9:
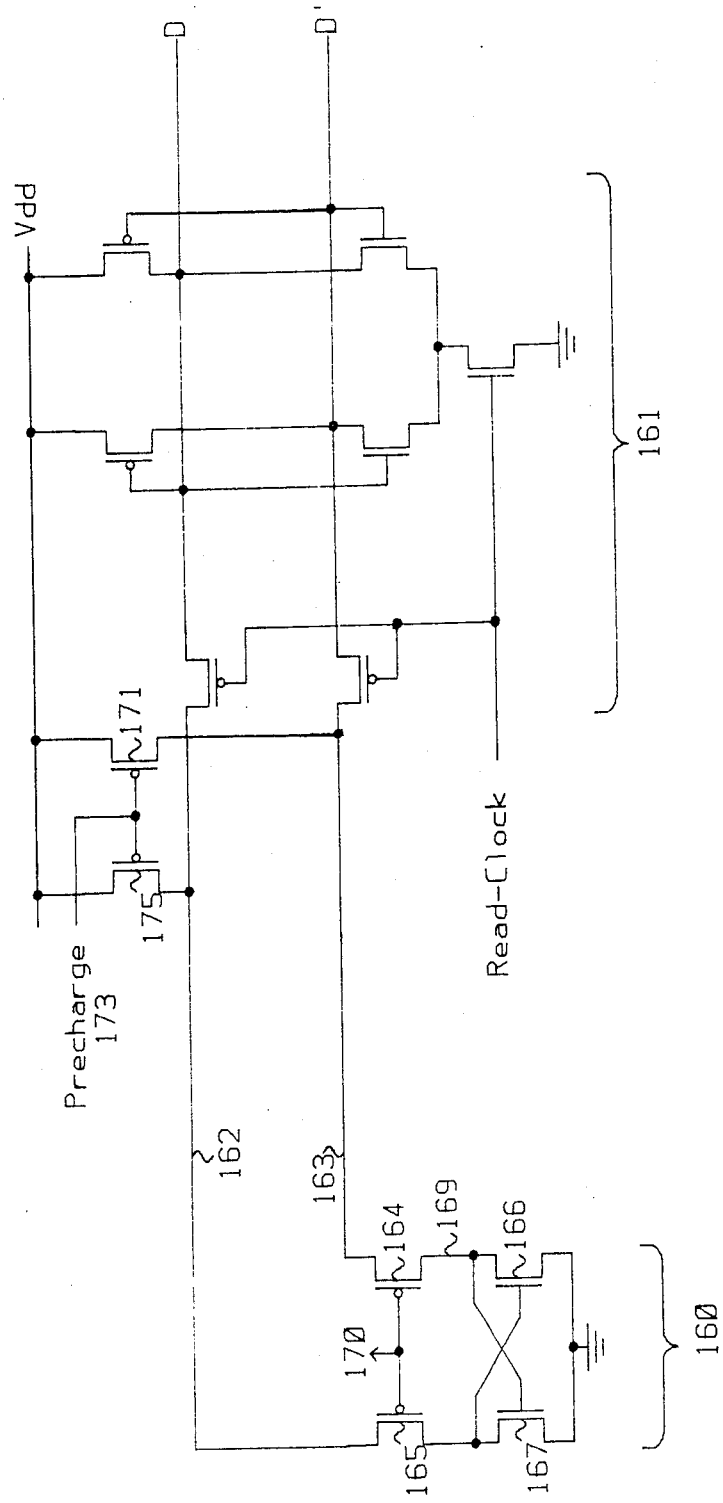
FIG. 9 is a schematic diagram of a memory cell according to the present invention connected to a sense amplifier for reading said memory cell.

The memory cell of the present invention is preferably read with the aid of a sense amplifier. The sense amplifier significantly improves the speed with which the memory cell may be interrogated. The preferred mode of reading the memory cell may be more easily understood with reference to FIG. 9 which is a schematic diagram of a memory cell 160 according to the present invention connected to a sense amplifier 161. Prior to reading memory cell 160, the bit lines 162 and 163 are at Vdd, and the bus coupling field effect transistors 164 and 165 are biased such that said bus coupling field effect transistors are conducting the small bias current described above. The potentials on bit lines 162 and 163 are set by pre-charge field effect transistors 175 and 171 which are controlled by a pre-charge signal 173. For the purposes of this discussion, it will be assumed that field effect transistor 166 is conducting and field effect transistor 167 is not conducting. Hence, the drain 169 of field effect transistor 166 will be at a low potential.

To read memory cell 160, word line 170 is lowered to ground. When this occurs, the source to drain impedance of field effect transistor 164 decreases and a current flows from bit line 163 through field effect transistors 164 and 166. As a result, the potential on bit line 163 decreases, because part of the potential drop from Vdd to ground appears across pre-charge field effect transistor 171. This decrease in the bit line 163 potential results in a decrease in the gate to source voltage on field effect transistor 164 which in turn results in an undesirable increase in the source to drain impedance of bus coupling field effect transistor 164. This increase in impedance slows the rate at which bit line 163 equilibrates after word line 170 is lowered. To obtain the shortest reading time, circuitry which does not depend on the final equilibrium value of the bit lines must be used. Sense amplifier 161 which is conventional in design provides a means for measuring the initial small drow in potential on bit line 163 due to the current flow, and converting said potential drop into signals D and D' which reflect the state of memory cell 160. The data signals D and D' are valid at the completion of the read cycle after the rising edge of the READ-CLOCK signal.

A second potential problem in reading memory cell 160 is "read disturb", i.e., changing the state of the memory cell in the process of reading the state thereof. The capacitances of the bit lines 162 and 163 are, in general, large compared to the gate capacitances of field effect transistors 166 and 167. Hence, if the source to drain impedances of the bus coupling field effect transistors 164 and 165 are not sufficiently large, coupling field effect transistors 166 and 167 to the bit lines could result in the state of memory cell 160 being changed. To avoid such read disturb conditions, the source to drain impedance of the bus coupling field effect transistors when said bus coupling field effect transistors are "on" must be larger than the source to drain impedance of the field effect transistor, 166 or 167, which is in the conducting state. To provide immunity from noise on bit lines 162 and 163, the "on" source to drain impedances of field effect transistoss 164 and 165 are preferably at least twice the "on" source to drain impedance of field effect transistors 166 and 167.

However, the source to drain impedance of field effect transistors 164 and 165 should be less than three times the source to drain impedance of field effect transistors 166 and 167. If the "on" source to drain impedance of field effect transistors 164 and 165 is too large relative to the "on" source to drain impedances of field effect transistors 166 and 167, the time needed to read memory cell 160 will be significantly increased. Hence an "on" source to drain impedance ratio of two to three is preferred.

This impedance ratio requirement favors designs in which field effect transistors 166 and 167 are n-channel devices, and field effect transistors 164 and 165 are p-channel devices. The source to drain impedance of a field effect transistor is inversely proportional to the width of the channel region and the carrier mobility. The mobility of an electron is approximately twice that of a hole. Hence, a source to drain impedance ratio of 3 may be obtained using transistors for field effect transistors 164 and 165 which are 1.5 times the width of the transistors used for field effect transistors 166 and 167 if field effect transistors 166 and 167 are the n-channel devices. If instead, field effect transistors 166 and 167 were the p-channel devices, the widths of field effect transistors 164 and 165 would need to be 6 times as wide as field effect transistors 166 and 167. Since the minimum width of the smaller transistors is set by fabrication constraints, this latter memory cell would be significantly larger than the preferred memory cell in which the field effect transistors 166 and 167 are n-channel devices.

5. Writing a Memory Cell According to the Present Invention

Figure 10:
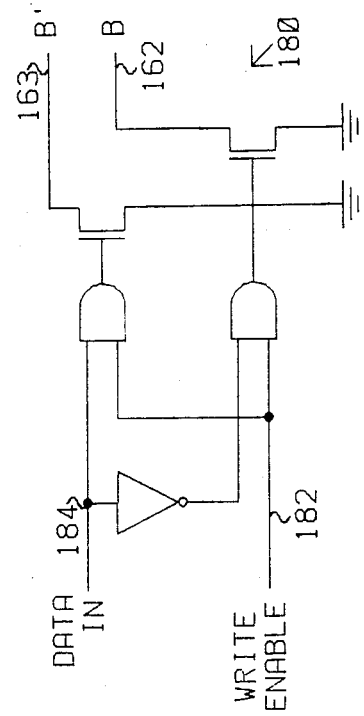
FIG. 10 is a schematic diagram of a circuit for writing a memory cell according to the present invention.

Referring again to FIG. 9, the state of memory cell 160 may be changed by propagating a low signal through one of the bus-coupling field effect transistors, 164 or 165, to turn off the field effect transistor whose gate is coupled to said bus-coupling field effect transistor. A conventional circuit for accomplishing this is shown in FIG. 10 at 180. During the writing process, the bit lines 162 and 163 are coupled to the sense amplifier and pre-charge circuitry shown in FIG. 9, and said bit lines are in the pre-charged state. That is, field effect transistors 175 and 171 are "on". The desired new state for the memory cell is specified by a signal on input 184. When a write enable signal is applied to input 182, the appropriate bit line is lowered.

6 Address Decoding Circuitry

In a memory such as that shown in FIG. 6, the choice of which word is coupled to the read/write circuitry at any given time is specified by an address decoding circuit. If the memory in question has $2^N$ words, an N bit binary number is typically used to specify the "address" of each word. This address is used to activate the word line associated with that word while holding all other word lines in the inactive state. Only after the appropriate word line has been activated can the word in question be accessed for reading or writing. Hence, decode circuits having minimal delays are highly desirable.

The simplest decoding circuit which accomplishes this is typically an array of NOR gates. The inputs to this array are the bits of the address in question and their complements. The outputs of this array are the word lines. Each NOR gate holds its output in the inactive state (low ) state until exactly the right combination of input bits is detected.

The time needed to decode an address using such a prior art array often places a lower limit on the time needed to read or write a word in the memory. When an array of NOR gates is used to decode the address, each word line is coupled to the active power terminal by a series circuit having N transistors in series. Each of these gates has a finite impedance and capacitance. Hence, if N is large, the time needed to propagate a sigal through the array can be significantly longer than the time needed to read or write a word. To avoid this address decoding delay, prior art memory systems have often given up the advantages and simplicity of such a static decoding circuit for the higher speed obtainable with more complex dynamic decoding circuits.

A decoding circuit according to the present invention avoids the long delays associated wth prior art static decoding circuitry while retaining the desirable features of a static decoding system. Basically, the decoding circuit of the present invention replaces the series connected pullup transistors of the NOR gates used in prior art decoding circuits with a tree-like structure which provides one connection path to the active power terminal. The active power terminal is at the root node of said tree. This root node connects this power rail to two or more branches, each of which may in turn be connected to a root node of a "sub-tree". In a decoding circuit for decoding an N-bit binary address, the branching ends at $2^N$ "leaf" nodes. The word lines are connected to these leaf nodes. With the exception of the leaf nodes there are a plurality of branches connected to each node. Each branch includes a series connected switch which is used to complete the connection from the node from which it branched to the node connecting said branch to its sub-tree or leaf node. Each of the branching connections at a given node is made by closing a switch in the desired branch and opening a corresponding switch in each of the unselected branches coupled to the node in question. Each of the leaf nodes is connected to two or more "pull-down switches" which connect the non-selected word lines to the inactive power terminal which is usually ground. As will be explained in more detail below, the number of pull-down switches depends on the number of levels of branching in the tree structure.

Figure 11:
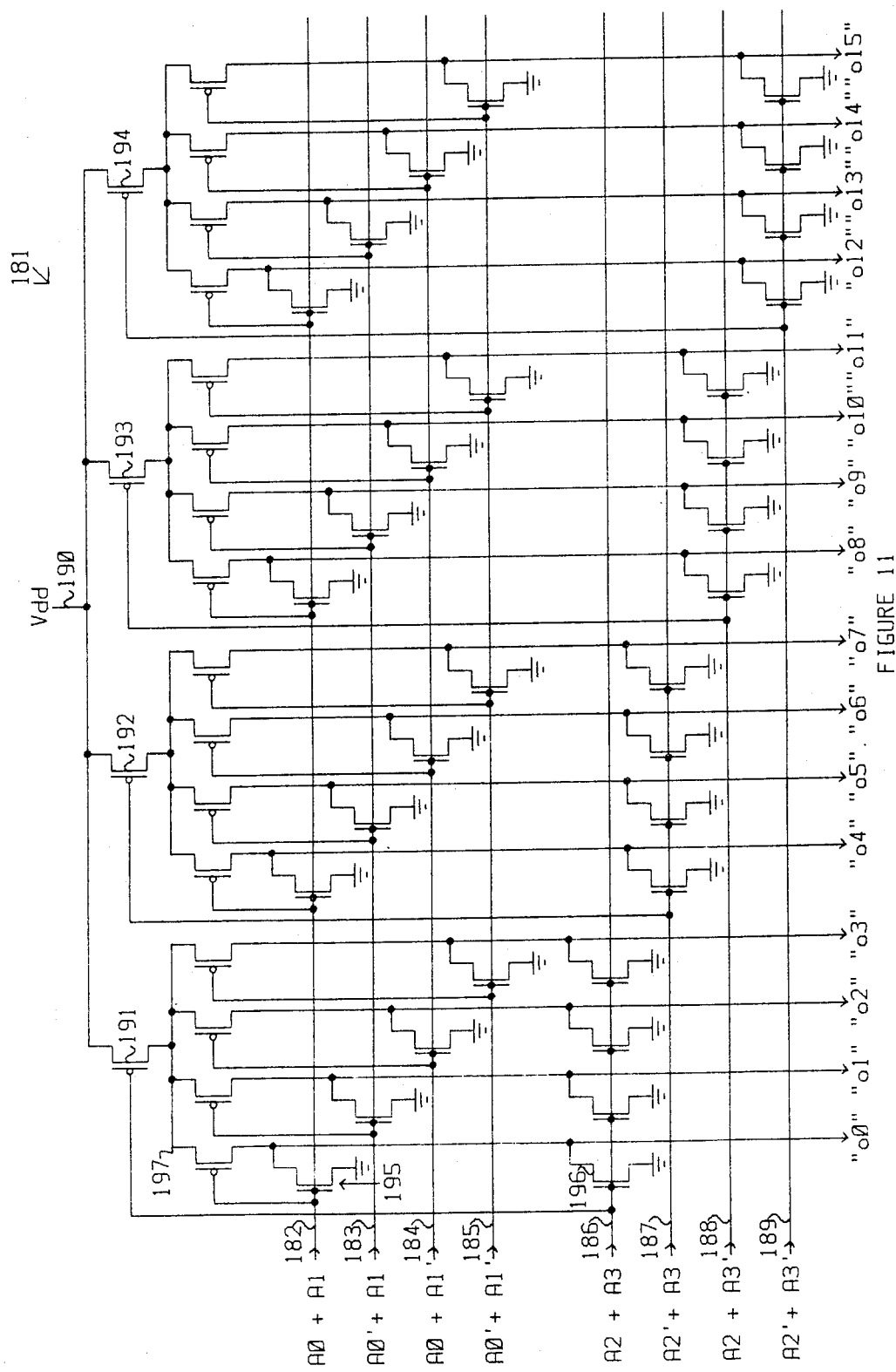
FIG. 11 is a schematic diagram of a decoder circuit according to the present invention.

The operation of a decoder according to the present invention may be most easily understood with reference to FIG. 11 which is a schematic diagram of a two level decoding circuit having four branches at each node. The decoding circuit 181 is used to decode a 4 bit binary address into 1 of 16 outputs. The 4 bit binary address is specified by four signals, A0 through A3, which are pre-decoded to form the eight input signals shown at 182 through 189. For example, input 183 is high if A0 is low and A1 is high. The circuitry used to perform this pre-decoding function will be described in detail below. The outputs of the decoder are labeled "o0" through "o15".

The decoding tree has four branches at each of its two levels. At the first level, the root node 190 branches into the four nodes controlled by field effect transistors 191 through 194. At the second level, each of these four nodes branches into four leaf nodes, each leaf node being connected to one of the 16 outputs. For example, the node connected to field effect transistor 191 branches into leaf nodes "o0" through "o3". Each of the leaf nodes is connected to the sources of two pull-down field effect transistors used to pull the node in question to ground if said node is not the node specified by the address signals. For example, when "o0" is not selected, at least one of field effect transistors 195 or 196 will be conducting.

For any given combination of input signals, only one output will be connected to Vdd by the decoding circuit 181. The remaining outputs will be held at ground by the one of the pull down field effect transistors connected to each of said unselected outputs. The path from Vdd to the selected output consists of a series connection through two field effect transistors. For example, when "o0" is selected, it is connected to Vdd through field effect transistors 191 and 197.

In general, an N-bit decoder having 4 branches at each node will interpose N/2 field effect transistors between Vdd and the selected output. A similar reduction may be obtained with a conventional decoder if the address signals are also pre-decoded. However, such a conventional decoder would require a greater area of silicon to construct then the present invention. In a conventional decoder, the impedance of the path to the selected output is the sum of the N/2 impedances of the individual transistors used to construct the NOR gates. Each of these transistors must be identical to the other transistors in the array. Hence, if a path impedance of Z ohms is to be maintained, each transistor must have an impedance of no more than 2Z/N ohms. This sets the minimum size of the array, since the impedance of each transistor is inversely proportional to the width of that transistor.

In a decoding circuit according to the present invention, the path impedance is also the sum of the impedances through the various branch switches. For example, the impedance from input "o0" to Vdd is the sum of the impedances of field effect transistors 191 and 197. However, in the present invention, the impedances of the higher level switches may be made significantly less than the impedances of the lower level switches by allocating more silicon surface area to said higher level switches. Since there are a smaller number of higher level switches than lower level switches, this results in both a net speed improvement and a net decrease in the area of silicon needed to construct the decode circuit as can be seen from the following example.

Suppose that a path impedance of no more than Z ohms may be tolerated in a 4 bit decoding circuit such as that shown in FIG. 11. In a conventional decoding circuit in which the address lines are pre-decoded, two transistors would be needed for each path. Each transistor could have a maximum impedance of Z/2 ohms. The impedance of each transistor is proportional to L/W, where L and W are, respectively, the length and width of the channel of the field effect transistor. The area of silicon required to construct each field effect transistor is approximately that required to construct the channel of the transistor in question, i.e., LW. For convenience, we will assume that all field effect transistor channels are of unit length. Hence, the total area of silicon needed for one path in a conventional decode circuit is 4/Z.

Referring again to FIG. 11, and particularly to the path to output o0, the impedance of the path in question is the sum of the impedances of field effect transistors 191 and 197. The effective area of silicon needed for said path is the area of field effect transistor 197 plus one quarter the area of field effect transistor 191, since field effect transistor 191 is shared by four paths. Suppose field effect transistor 191 is 4 times wider than field effect transistor 197. Here, it is also assumed that the field effect transistors in question have channels of unit lenghh. To form a series combination with an impedance of Z, the width of field effect transistor 197 need only be 1.25/Z, compared to 2/Z in the conventional decode circuit discussed above. As a result, the effective area of silicon used to construct the path is only 2.5/Z as compared to 4/Z for the conventional decode circuit.

The above comparison applies to the routing transistors used in the NOR gate embodiment and in the present invention. In addition, a static NOR gate decoder also requires pull-down transistors on each output thereof. Hence, prior art NOR gate decoders also include N/2 "pull-down" transistors per output path. These transistors are analogous to field effect transistors 195 and 196 shown in FIG. 11. Hence, both types of decoder require approximately the same area for the pull-down network needed to ground the unselected paths. This pull-down network typically occupies about one half the surface area devoted to a prior art decoder, the other half being devoted to the NOR gates whihh perform the routing operations analogous to field effect transistors 191 and 197. Since the present invention requires about half the area to construct the routing operations and the same area to construct the pull down network, a decoder according to the present invention requires about 25% less area than a decoder of conventional design.

Figure 12:
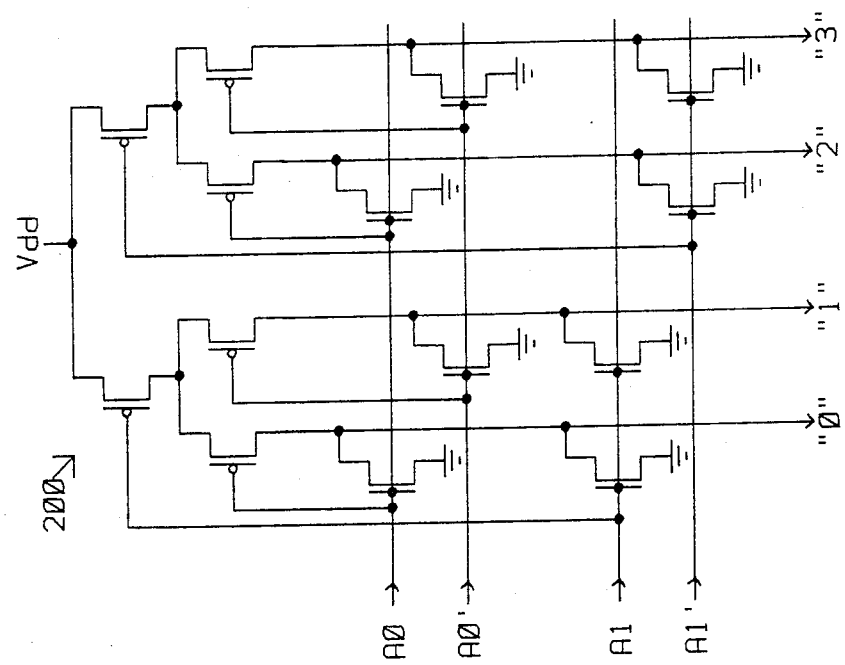
FIG. 12 is a schematic diagram of a predecoder for use with the decoder circuit shown in FIG. 11.

As mentioned above, input signals to the present invention consist of a series of pre-decoded signals derived from the binary address in question. These signals may be generated by a small binary tree decoder similar to the larger tree shown in FIG. 11. Such a tree is shown in FIG. 12 at 200. The binary tree 200 has two levels with each level branching into two paths. The branching ends in 4 output nodes labeled, "0" through "3".

Figure 13:
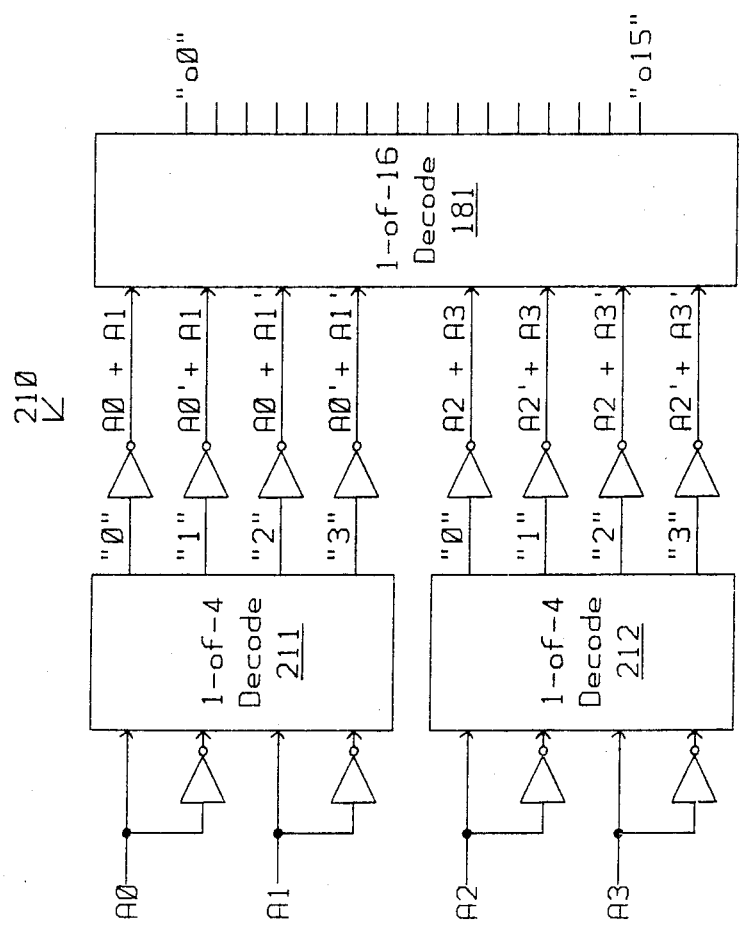
FIG. 13 is a block diagram of a decoder circuit according to the present invention.

Two such binary decoders may be combined to generate the pre-decoded signals 182 through 189 shown in FIG. 11. Such an arrangement is shown at 210 in FIG. 13. The lower two address bits, A0 and A1, are decoded by a first binary decoder 211. The higher two address bits, A2 and A3, are decoded by a second binary decoder 212. Each of these binary decoders may be of the type shown in FIG. 12.

The optimum number of levels and branching factor at each level will, in general, depend on two factors, the size of the memory being accessed with the decoder and the radix of the number system in which the address is represented. Large memory systems favor higher branching factors. Each routing transistor introduces a delay into the decoding which results from time needed to charge its parasitic capacitance. Thus, smaller numbers of levels are preferred. To reduce the number of levels, one must increase the branching factor at each node. The maximum branching factor is determined by the area needed to construct the conductors which couple the pre-decoded signals to the various pull-down transistors. These conductors account for the majority of the area needed to construct the pull-down array. The branching factor at each node is chosen to provide as small a pull-down array area as possible while still maintaining sufficient decoding speed, i.e., minimizing the number of levels in the routing tree.

Consider a decoder for decoding an N-bit address into one of $2^N$ lines. If it is assumed that the same branching factor is used at each node, the number of pre-decode lines need per address bit is given by the function $K/\log_2(K)$, where K is the branching factor at each node. This function has a minimum value of 1.893 which occurs for K=3. For K=2 or 4, the corresponding value is 2, and for K=8, the value is 2.33. The function increases rapidly for higher K values. The area of the pull-down array is related to the number of pre-decode lines which must be run accross the pull-down array. Hence K branching factors less than or equal to 8 are preferred, since branching factors greater than 8 result in too large an area of silicon being devoted to the pull-down array. Although this function has a minimum for K=3, branching factors of 2 or 4 are preferred over a branching factor of 3 in binary addressed memory systems, since a branching factor of 3 may be difficult to implement in such a system.

However, a branching factor of 2 is, in general, not preferred. A decoder with a branching factor of 2 requires twice as many decoder tree levels and about twice as many transistors as decoder based on a branching factor of 4. Hence, the preferred branching factor is 4 or 8.

The choice of branching factor, 2 or 4, depends in general on the size of the memory system. A decoder based on a branching factor of 8 may be preferrable to a decoder based on a branching factor of 4 in large decoders. Here, the slight increase in the area of the pre-decode signal conductors may be more than compensated for by the reduction in the number of tree levels and transistors. This reduction results in a faster decoder in large memory systems.

It should be noted that tree decoders having K=2 have been used in the prior art, such as in the two bit to four line decoder shown in FIG. 12. In any size memory system, the binary tree is faster and requires fewer transistors than the straightforward NOR-gate approach. However, the extension of this concept to trees with higher branching factors has not been attempted in prior art decoder circuits. As discussed above, this extension results in a significant further improvement in speed and in the number of transistors required.

Although the above examples have all related to decoders in which the branching factor at each level is the same, the present invention may be practiced with different branching factors at each level. Such embodiments of the present invention are particularly useful in non-binary decoders.

Figure 14:
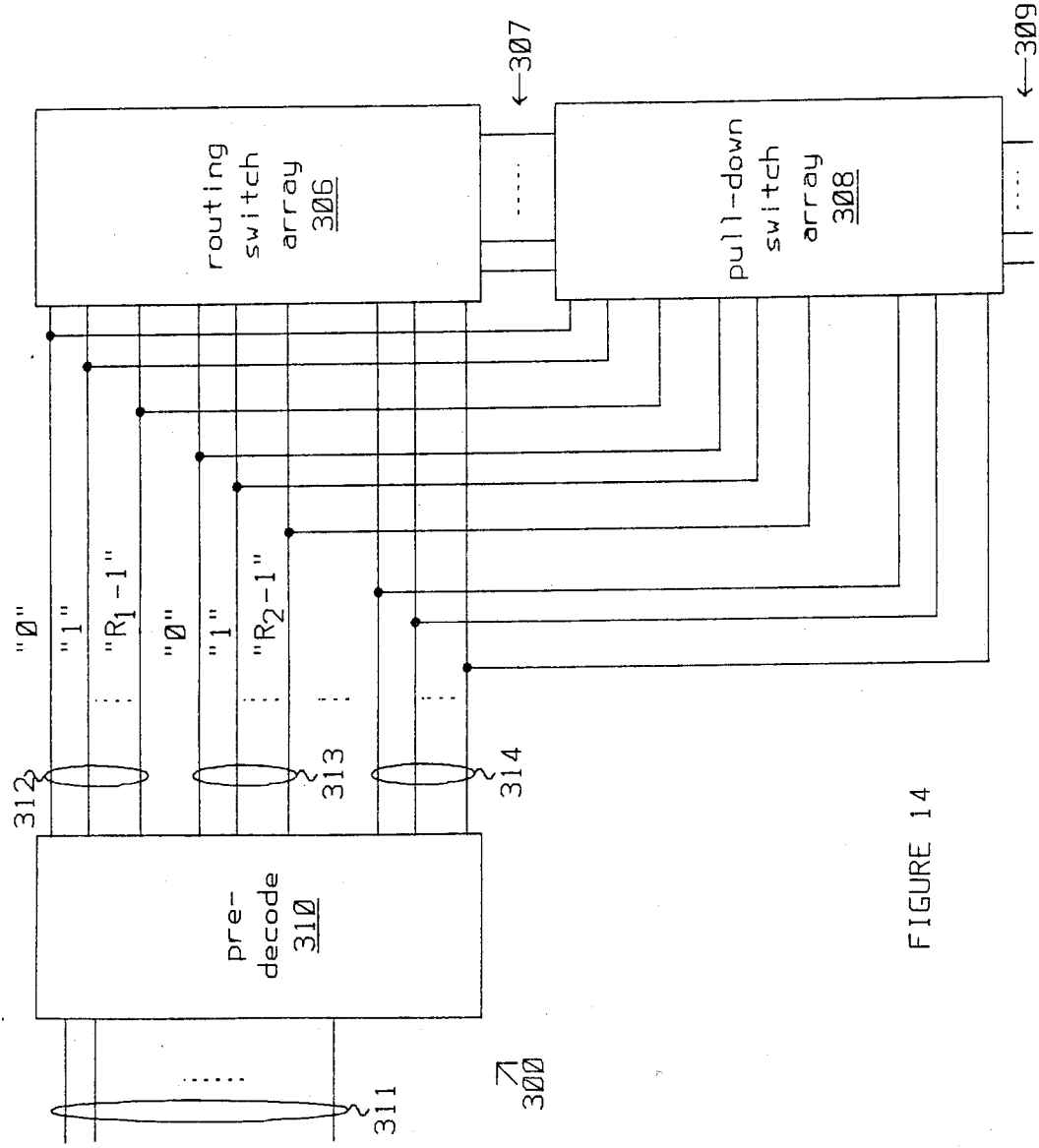
FIG. 14 is another block diagram of a decoder circuit according to the present invention.
Figure 15:
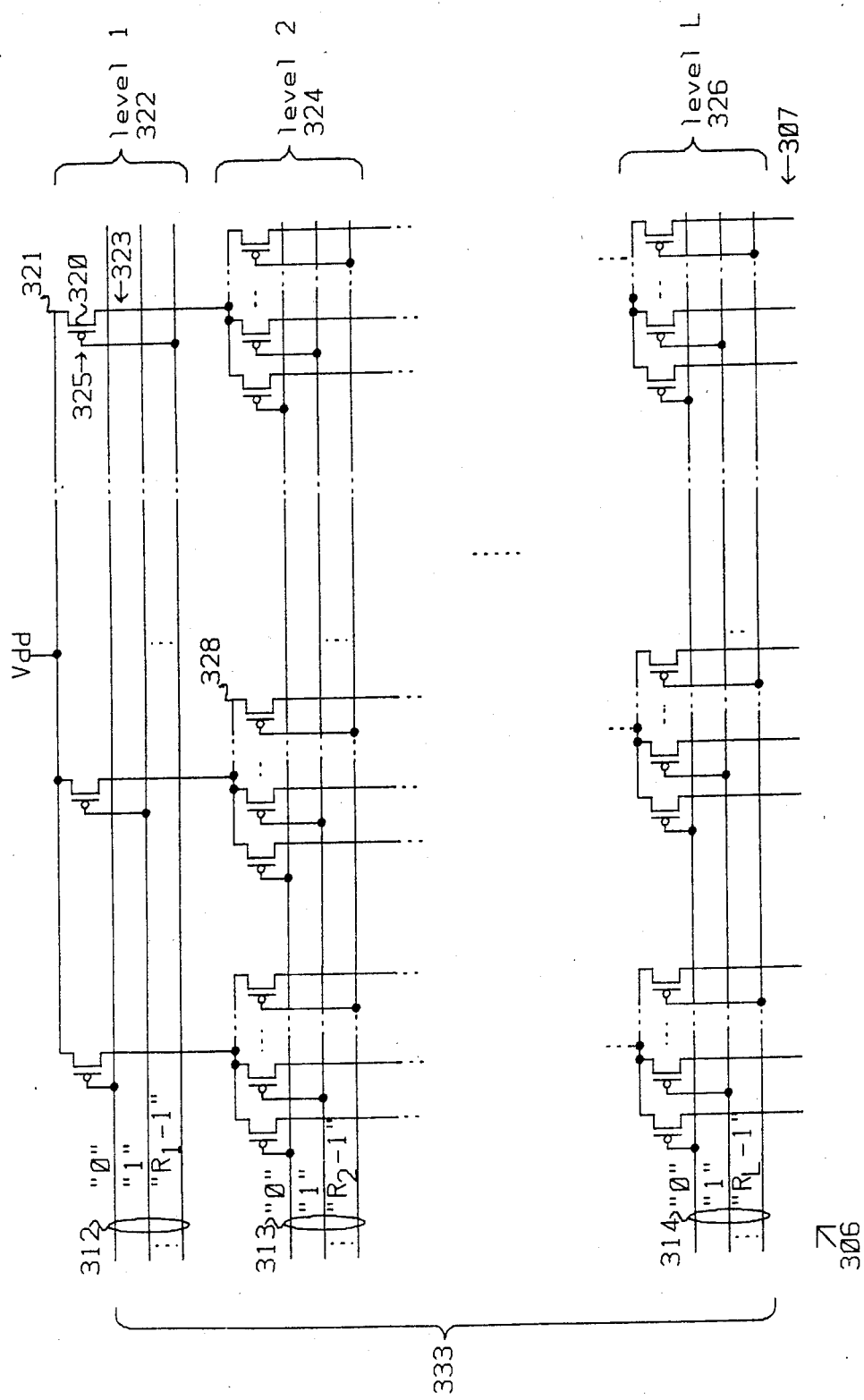
FIG. 15 is a schematic diagram of a routing switch array according to the present invention.
Figure 16:
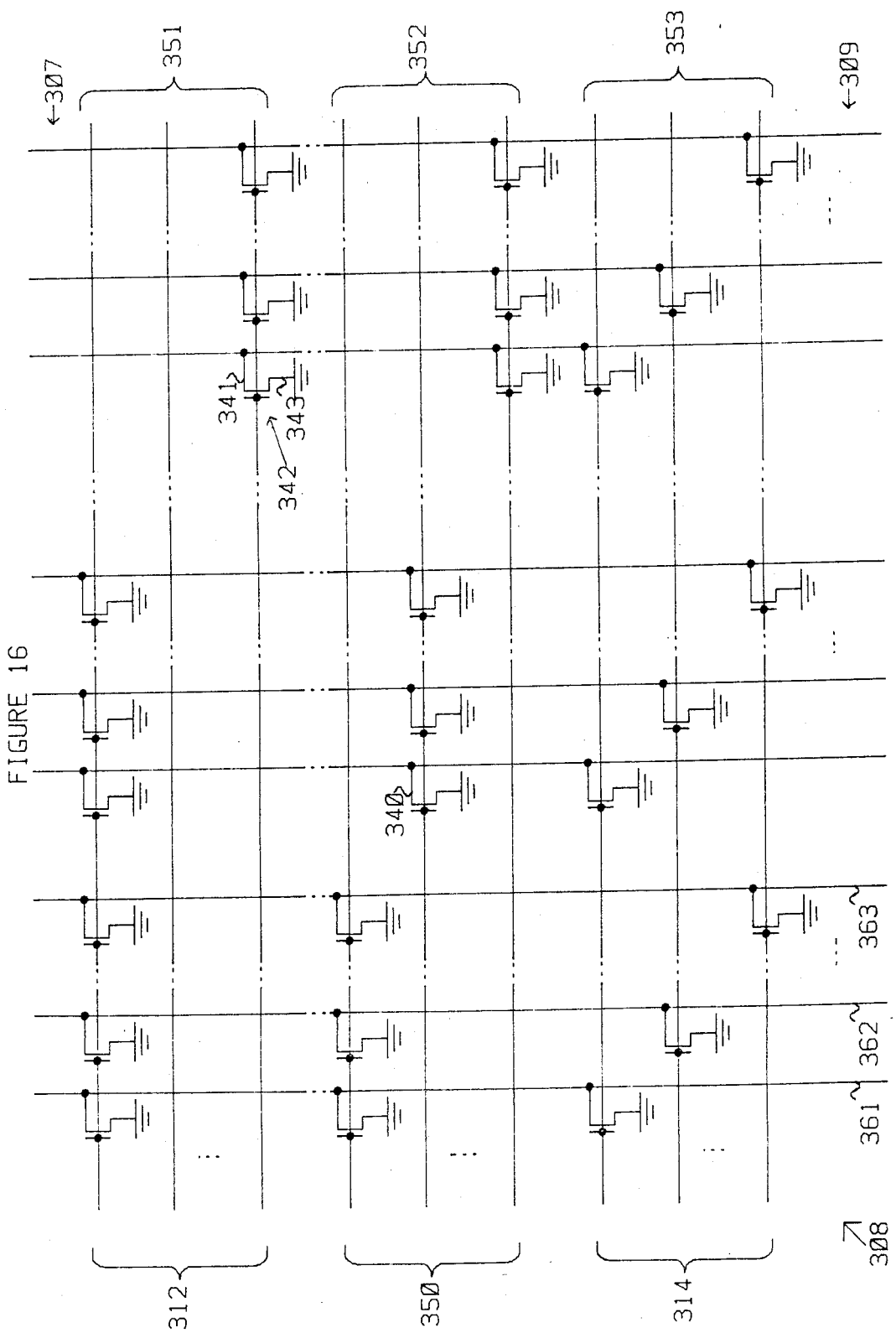
FIG. 16 is a schematic diagram of a binary pull-down switch array according to the present invention.

FIGS. 14, 15, and 16 illustrate a more general decoder according to the present invention. FIG. 14 is a block diagram of a decoder according to the present invention. Broadly, the decoder 300 operates by first converting the address from a binary coded representation thereof to an L digit representation in which each "digit" may have a different radix. This is accomplished by predecoder 310. The L digit representation of the address is then used to control two switch arrays, 306 and 308. The output of pull-down switch array 308 consists of the N decoded output lines shown at 309.

For each binary coded address input to the pre-decoder 310, precisely one of the output lines 309 will be have a signal present on it.

In the following discussion, the radix of the ith digit will be referred to as $R_i$, and L will be used to denote the number of levels in routing switch array 306 which is a tree structure. For example, in the two level K=4 decoder described above, each address is predecoded into a two digit representation in which each digit has radix 4.

Referring to FIG. 14, the binary coded address is converted to the L digit representation thereof by a pre-decoder 310. The pre-decoder 310 has as its inputs the binary coded representation of the address in question. This address is communicated as one or more signals on a set of input lines shown at 311. The output of the pre-decoder 310 consists of L groups of output lines. Each group of output lines represents one digit of the L digit representation of the binary address to be decoded. The value of the digit is communicated by placing a signal on one of the output lines in the group of output lines representing the digit in question. Hence, the number of output lines in each group is equal to the radix of the digit in question.

Three groups of output lines are illustrated in FIG. 14 at 312, 313, and 314. Group 312 is used to communicate the value of the most significant digit of the L digit representation of the address. This digit will be defined to be the first digit of the L digit representation, the least significant digit being defined to be the Lth digit of the L digit representation. Group 312 has $R_1$ lines which are labeled from "0" to "$R_1-1$". The labels indicate the value of the digit in question which gives rise to a signal on the line bearing said label. Similarly, group 313, which represents the second most significant digit of the L digit representation, has $R_2$ lines labeled from "0" to "$R_2-1$".

The output of pre-decoder 310 is used to control a routing switch array 306 and a pull-down switch array 308. The routing switch array couples the particular output line 309 specified by the binary coded address present on inputs 311 to a first potential. The pull-down switch array 308 couples all of the remaining output lines to a second potential which is typically ground.

The routing switch array 306 is shown in more detail in FIG. 15. Routing switch array 306 is divided into L levels. Each level corresponds to one digit of the L digit representation of the binary coded address. Each level comprises a plurality of switches 320 which are preferably field effect transistors. Each switch has an input terminal 321, a control terminal 325, and an output terminal 323. Each switch connects a node in the level above it which is connected to its input terminal to a node in the level below it which is connected to its output terminal in response to a signal on its control terminal. The control terminal 325 of each switch 320 is connected to one of the output lines of pre-decode circuit 310. The input terminals of the switches of the first level are connected to a power rail at the first potential, Vdd. The output terminals of the switches in the Lth level are coupled to N output lines 307. Each of the output lines 307 corresponds to one of the decoder outputs shown at 309 shown in FIG. 14.

The switches in each level of routing switch array 306 are controlled by the pre-decode output lines 333 which specify the digit of the L digit representation which corresponds to said level. Thus, the first level 322 is controlled by output lines 312 which specify the most significant digit of the L digit representation. The second level 324 is controlled by output lines 313 which specify the second digit. And, the Lth level 326 is controlled by output lines 314 which specify the least most significant digit of said L digit representation.

The switches comprising each level of routing switch array 306 are organized into groups. At the Jth level, the number of groups of switches is given by $$\pi_{i=1}^{J-1} R_i$$

Each group contains $R_J$ switches. The first level of the routing switch array 306 has only one group. The input terminals 321 of all of the switches in a given group are connected to an output terminal 323 of a switch in the level above that containing the group in question. Similarly, the output terminal 323 of each switch in a group is connected to the input terminals of a group of switches in the level below that containing the group in question. The control terminals of the switches in each group are coupled to the pre-decode output lines corresponding to the digit in question. For example, level 2 of the routing switch array consists of $R_1$ groups of switches of which group 328 is typical. Each switch in group 328 is connected to one of the output lines 313 used to represent the second digit. Corresponding switches in each group are coupled to the same output line. That is, the first switch in each group is coupled to the output line for signaling a "0" for the digit in question. The second switch in each group is coupled to the output line used to signal a "1" for said digit, and so on. When a signal is present on an output line, all of the switches connected to that output line are set to the closed state. That is, each of the switches completes a circuit between its input and output terminals.

For any given pattern of L signals on the predecode output lines 333, one of the output lines shown at 307 will be connected to Vdd. The remaining output lines will be "floating", since they are not connected to either Vdd or ground. Hence, a means must be provided to couple the unselected lines to a second power rail which is typically shown as ground. The pull-down switch array 308 shown in FIG. 16 provides this coupling.

Referring to FIG. 16, the pull-down array 308 also consists of a plurality of switches of which switch 340 is typical. Each switch includes an input terminal 341, an output terminal 343, and a control terminal 342. However, in contrast to the switches shown in FIG. 15 switches 340 are normally closed. That is, each switch 340 interrupts a connection between said switch's input and output terminals in response to a signal on its control terminal. Switches 340 are preferably field effect transistors of the opposite channel type from those used to construct switches 320 shown in FIG. 15.

Pull-down switch array 308 is also organized into L levels. The switches on each level are controlled by pre-decode outputs corresponding to the digit in question. These are the same predecode outputs of predecoder 310 that are used by the routing switch array 306 described above. Three such levels are shown in FIG. 16. The first level 351 is controlled by pre-decode output lines 312 which represent the most significant digit of the L digit representation of the binary coded address in question. The third level 353 shown in FIG. 16 is controlled by pre-decode output lines 314 which represent the least significant digit of the L digit representation. For clarity, the second level 352 shown in FIG. 16 is the (L−1)st level which is controlled by pre-decode outputs 350 which represent the next to the least significant digit. Outputs 350 were omitted from FIG. 14 to simplify said figure.

Pull-down array 308 couples each of the output nodes 307 of the routing switch array to the corresponding output node of the decoder of the present invention which are shown at 309. Pull-down switch array 308 has L switches coupled to each of the output nodes 309. One such switch corresponds to each level of pull down array 308. If any of the switches coupled to a given output node does not have a signal present on its input terminal, the output node 309 in question will be coupled to a second potential which is shown as ground.

The connections of the various input terminals of switches 340 may be most easily specified with reference to the L digit representation of the binary coded address. Each of the output nodes 309 may be labeled with the digits of the L digit representation of the binary coded address of said output node. For example, output node 361 corresponds to the L digit number having digits "0,0, . . . 0,0". Output node 362 corresponds to the L digits "0,0, . . . ,0,1". Finally, output node 363 corresponds to L digits "0,0, . . . ,0,$R_L$−1".

Consider the Pth one of the L switches coupled to the Qth output node. If the L digit representation of the binary address correspnding to the Qth node is $D_1, D_2, \ldots, D_L$, then the control terminal of the Pth switch would be coupled to the $D_P$th line of the group of pre-decode output lines representing the Pth digit of the L digit representation. The control terminal of the first switch coupledt o the Qth node would be connected to the $D_1$st pre-decode output line of the group of output lines representing the first digit of the L digit representation. The second switch coupled to said node would be coupled to the $D_2$th pre-decode output line of the group of output lines representing the second digit, and so on. Hence, when the L digit representation of the binary coded address matches the label for the output node in question, all of the switches 340 coupled to that node will be open and the node in question will be free to rise to Vdd. If any digit of the L digit number does not match the label in question, then the node will be held at ground by the switch corresponding to said mismatch.

This general decoding technique may be used to implement address systems for selecting 1 of N lines. Here, N need not be a power of two. For example, decimal coded addresses are often used in data processing applications. In this case, the address is normally specified as a plurality of binary coded decimal (BCD) digits. Each said digit is represented by four bits; however, only the first ten states of the possible 16 states are used.

Figure 17:
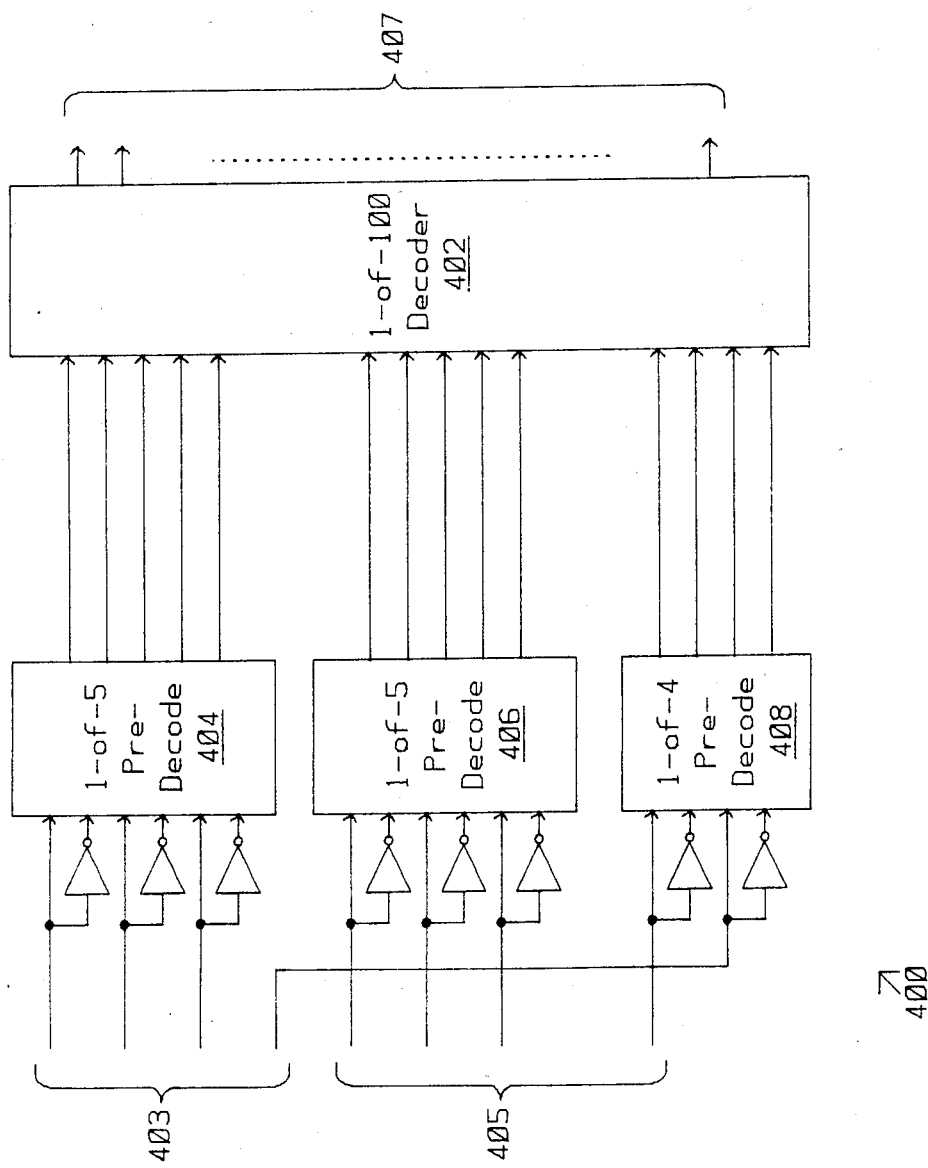
FIG. 17 is a block diagram of a binary coded decimal decoder according to the present invention.

FIG. 17 illustrates a decoder circuit according to the present invention for decoding two BCD coded digits into a 1-of-100 format. The decoder circuit 400 employs a three level decode tree circuit 402. The first two levels of tree circuit 402 have branching factors of 5, and the third level has a branching factor of 4. That is, the equivalent 3 digit number has radices of 5 for its two most significant digits and a radix of 4 for its least significant digit. This 3 digit number has 100 possible states corresponding to the 100 possible output lines which are shown at 407.

The BCD coded address is separated into three groups of lines for decoding into the above three digits. The most significant digit of the three digit number is obtained by decoding the three most significant bits of the first BCD digit 403 using a 1-of-5 pre-decoding circuit 404. By definition, these three bits specify at most five states, since the remaining states are not used in a BCD coding scheme. The second most significant digit of the three digit number is obtained by decoding the three most significant bits of the second BCD digit 405 using a second 1-of-5 pre-decoding circuit 406. These three bits also specify five states. Finally, the third digit of the three digit number is obtained by decoding the least significant bits of each of the two BCD digits using a 1-of-4 pre-decoding circuit 408.

An alternative method of converting a two digit BBCD number to a 1-of-100 representation would be to use a two level decoding circuit with each level having a branching factor of 10. However, this approach would lead to a larger decoding circuit. As noted above, the number of lines needed to distribute the pre-decoded data across the tree configured decode circuit determines the size of the pull-down switch array 308 shown in FIG. 14. If the decoder circuit is constructed as a two level decode tree, 20 lines will be required. The decoder circuit 400 shown in FIG. 17 only requires 14 such lines. Hence, decoder circuit 400 is preferred because of its smaller size.

In the preferred embodiments of the static decoders such as that shown in FIG. 14, transistors of one channel type are used in the routing switch array 306 and transistors of the opposite channel type are used in the pull-down switch array 308. This allows each of the conductors connecting the pre-decode circuit 310 to the routing switch array 306 and pull-down switch array 309 to simultaneously control the corresponding switches in both arrays. That is, a signal present on one of these conductors turns on a switches in the routing switch array 306 while simultaneously turning off switches in the pull-down array 308.

If both arrays were constructed from transistors of the same channel type, each such conductor would have to be replaced by a pair of conductors. One conductor would be used to connect a signal from the decode array 310 to the routing switch array 306. The other conductor would be used to connect the logical complement of said signal to the pull-down array 308. These additional conductors would significantly increase the area of silicon needed to construct the present invention.

It should also be noted that the pull-down array may be replaced with passive loads, one such load being connected to each output line 309. The passive loads in question could be constructed from resistors or depletion-mode field effect transistors. This somewhat simpler design requires less area of silicon to construct. However, its performance is inferior to the preferred embodiments discussed above in that the time needed to return an output line to an inactive state is longer.

Figure 18:
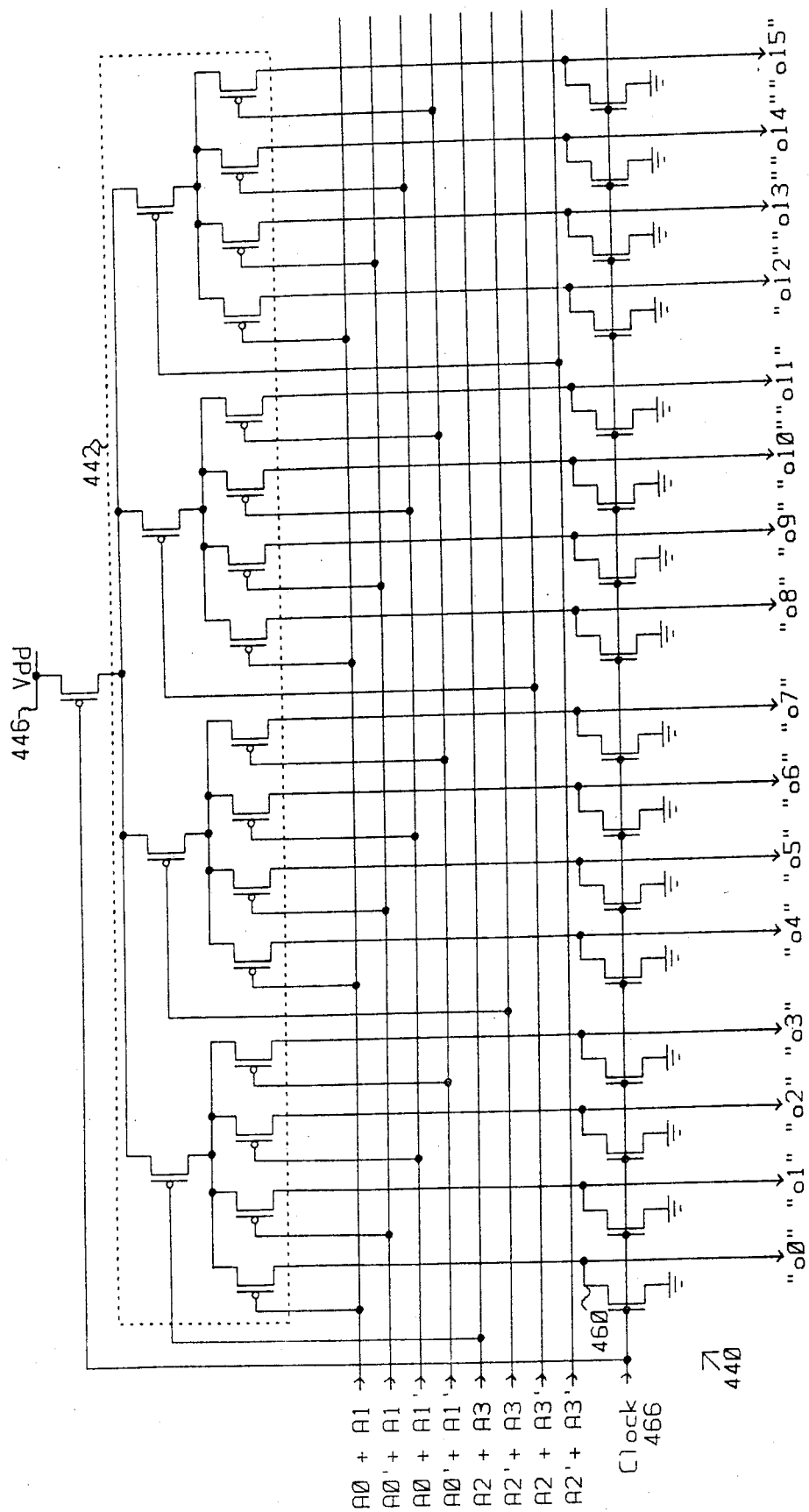
FIG. 18 is a schematic diagram of a dynamic decoder according to the present invention.

One prior art solution to the long times needed to decode an address using an array of static gates is to convert the static gate array to a dynamic decode array. Here, a clocked driver circuit replaces the pull-down switch array. The device is referred to as dynamic because the capacitance of the word lines is used to maintain the state of the device during part of the operation of the device. The present invention may also be constructed in a dynamic version by replacing the pull-down switch array 308 shown in FIGS. 14 and 16 with clocked switching transistors. This is illustrated in FIG. 18 at 440.

Decoder 440 is an exemplary dynamic 1-of-16 decoder circuit according to the present invention. For simplicity, the pre-decoding circuitry which is the same as that shown in FIGS. 12 and 13 has been omitted. Decoder circuit 440 consists of a two level routing switch array 442 in a tree configuration for connecting one of the possible 16 word lines shown at "o0" through "015" to a first power rail 446. Each level of the tree has a branching factor of 4. Each word line is connected to a discharge transistor of which 460 is typical. This discharge transistor couples the word line to a second power rail shown as ground when a clock signal 466 is not present. When the clock signal 466 is present, the discharge transistors 460 break the connection to ground and power is applied to the routing switch array 442. This results in the selected node being coupled to the first power rail 446 through routing switch array 442. It should be noted that the unselected nodes are not connected to either power rail when the clock signal is present. In this case, the capacitance of each word line is used to maintain the state of that word line at ground.

It will be apparent to those skilled in the art that the dynamic version of a decoder circuit according to the present invention is essentially the same as the static version thereof with a different form of "pulldown" switch array. Here, the pull-down switches connected to each output node have been replaced by a single transistor for coupling each word line to ground when the decoder is not enabling any word line.

Accordingly, there has been described a novel computer memory system based on a novel memory cell, driver circuit therefor, and a novel address decoder circuit. Various modifications in additional to those described above will readily be apparent to those skilled in the art. The scope of the present invention is therefore defined only by the following appended claims.

What is claimed is:

1. A memory cell having two stable states comprising:
   first and second read-write terminals for applying first and second potentials, respectively, to said memory cell;
   word select terminal for coupling either a bias potential or a select potential to said memory cell, said select potential selecting said memory cell for reading or writing, and said bias potential being applied when said memory cell is not so selected;
   a ground potential terminal for applying a third potential to said memory cell;
   first and second field effect transistors having a first channel type, the sources of said first and second field effect transistors being connected to said ground potential terminal, the gate of said first field effect transistor being connected to the drain of said second field effect transistor and the gate of said second field effect transistor being connected to the drain of said first field effect transistor in order to form two stable states, a different one of said first and second field effect transistors being conductive in each said state; and
   third and fourth field effect transistors having channel types opposite to those of said first and second field effect transistors, the drain of said third field effect transistor being connected to the drain of said first field effect transistor, the drain of said fourth field effect transistor being connected to the drain of said second field effect transistor, the source of said third field effect transistor being coupled to a first read-write terminal, the source of said fourth field effect transistor being coupled to said second read-write terminal, and the gates of said third and fourth field effect transistors being coupled to said word select terminal.

2. The memory cell of claim 1 wherein the source to drain impedances of said third and fourth field effect transistors when said select potential is applied to said word select terminal is between two and three times the source to drain impedance of the one of said first and second field effect transistors in said memory cell which is conductive.

3. The memory cell of claim 2 wherein said first and second field effect transistors are n-channel field effect transistors and said third and fourth field effect transistors are p-channel field effect transistors.

4. The memory cell of claim 1 further comprising a bias circuit for generating and coupling either said bias potential or said select potential to said wordselect terminal in response to a control signal coupled thereto, said bias circuit comprising:
 first terminal means for coupling said bias circuit to said select potential;
 second terminal means for coupling said bias circuit to a power supply potential;
 a first field effect transistor having the source thereof coupled to the gate thereof and the drain thereof to said first terminal means;
 means for causing a predetermined constant current to flow from the source to the drain of said first field effect transistor;
 a second field effect transistor having the same channel type as said first field effect transistor, the gate of said second field effect transistor being coupled to the gate of said first field effect transistor and the drain of said second field effect transistor being coupled to said first terminal means;
 a third field effect transistor having the opposite channel type from said first and second field effect transistors, the source of said third field effect transistor being coupled to the source of said second field effect transistor, the gate of said third field effect transistor being coupled to the source of said third field effect transistor, and the drain of said third field effect transistor being coupled to said second terminal means; and
 switch means responsive to said control signal for coupling said word line either to said first terminal means or to the source of said third field effect transistor.

5. The memory cell of claim 1 further comprising a bias circuit for generating and coupling either said bias potential or said select potential to said word-select terminal in response to a control signal coupled thereto, said bias circuit comprising:
 first terminal means for coupling said bias circuit to said select potential;
 second terminal means for coupling said bias circuit to a power supply potential;
 a first field effect transistor having the source thereof coupled to the gate thereof and the drain thereof to said first terminal means;
 means for causing a predetermined constant current to flow from the source to drain of said first field effect transistor;
 a second field effect transistor having the same channel type as said first field effect transistor, the gate of said second field effect transistor being coupled to the gate of said first field effect transistor and the drain of said second field effect transistor being coupled to said first terminal means;
 a third field effect transistor having the opposite channel type from said first and second field effect transistors, the source of said third field effect transistor being coupled to the source of said second field effect transistor, the gate of said third field effect transistor being coupled to said word line, and the drain of said third field effect transistor being coupled to said second terminal means; and
 switch means responsive to said control signal for coupling said word line either to said first terminal means or to the source of said third field effect transistor.

6. A bias circuit for coupling either a bias potential or a ground reference potential to a word line of a memory cell in response to a control signal coupled thereto, said bias circuit comprising:
 first terminal means for coupling said bias circuit to said ground reference potential;
 second terminal means for coupling said bias circuit to a power supply potential;
 a first field effect transistor having the source thereof coupled to the gate thereof and the drain thereof to said first terminal means;
 means for causing a predetermined constant current to flow from the source to the drain of said first field effect transistor;
 a second field effect transistor having the same channel type as said first field effect transistor, the gate of said second field effect transistor being coupled to the gate of said first field effect transistor and the drain of said second field effect transistor being coupled to said first terminal means;
 a third field effect transistor having the opposite channel type from said first and second field effect transistors, the source of said third field effect transistor being coupled to the source of said second field effect transistor, the gate of said third field effect transistor being coupled to the source of said third field effect transistor, and the drain of said third field effect transistor being coupled to said second terminal means; and
 switch means responsive to said control signal for coupling said word line either to said first terminal means or to the source of said third field effect transistor.

7. A bias circuit for coupling either a bias potential or a ground reference potential to a word line of a memory cell in response to a control signal coupled thereto, said bias circuit comprising:
 first terminal means for coupling said bias circuit to said ground reference potential;
 second terminal means for coupling said bias circuit to a power supply potential;
 a first field effect transistor having the source thereof coupled to the gate thereof and the drain thereof to said first terminal means;
 means for causing a predetermined constant current to flow from the source to the drain of said first field effect transistor;
 a second field effect transistor having the same channel type as said first field effect transistor, the gate of said second field effect transistor being coupled to the gate of said first field effect transistor and the drain of said second field effect transistor being coupled to said first terminal means;

a third field effect transistor having the opposite channel type from said first and second field effect transistors, the source of said third field effect transistor being coupled to the source of said second field effect transistor, the gate of said third field effect transistor being coupled to said word line, and the drain of said third field effect transistor being coupled to said second terminal means; and switch means responsive to said control signal for coupling said word line either to said first terminal means or to the source of said third field effect transistor.

8. A decode circuit for coupling a first potential to the Kth decode node of an N decode node array, wherein K runs from 0 to N−1, and coupling a second potential to the remaining ones of said N decode nodes, wherein N is the maximum number which may be represented by an L digit number in a number system in which the Ith digit has radix $R_I$, wherein at least one said radices is greater than two, and wherein K is represented by a binary coded number, said decode circuit comprising:

pre-decode means for converting said binary coded representation of K to an L-digit representation thereof, said pre-decode means comprising means for coupling said binary coded number to said pre-decode means; L groups of pre-decode nodes, the Ith said group of pre-decode nodes comprising $R_I$ nodes; and means for generating and coupling a signal to one node of each said group of pre-decode nodes in response to said binary coded number, the one of said pre-decode node to which said signal is coupled in the Ith group of predecode nodes being determined by the value of the Ith digit in the L digit representation of K;

routing means coupled to said L groups of predecode nodes for coupling said Kth decode node to a first power rail at said first potential in response to the signals on said pre-decode nodes; and pull-down means coupled to said L groups of pre-decode nodes for coupling all decode nodes other than the Kth said node to a second power rail at said second potential.

9. The decode circuit of claim 8 wherein said routing means comprises an L level array of routing switches, each said switch comprising an input terminal, an output terminal, and a control terminal, said input terminal being electrically coupled to said output terminal in response to a signal on said control terminal, wherein the Jth level of said L level array (for J running from 2 to L) comprises $R_{J-1}$ groups of routing switches, each said group comprising $R_J$ routing switches, the input of each routing switch in a given group of routing switches being coupled to the output of a routing switch comprising one of the routing switches in the (J−1)st level of said L level array, the first level of said L level array comprising $R_1$ routing switches, the input of each routing switch in said first level being coupled to said first power rail and the output of each routing switch comprising said Lth level being coupled to a corresponding decode node, and wherein the control terminal of the Mth switch of each group of switches comprising said Jth level (for J running from 1 to L) is coupled to the Mth decode node of the Jth group of decode nodes.

10. The decode circuit of claim 9 wherein said pull-down means comprises L pull-down switches coupled to each said decode node, each said pull-down switch comprising an input terminal, an output terminal, and a control terminal, said input terminal being electrically coupled to said output terminal in the absence of a signal on said control terminal, the output of each said switch being coupled to said second power rail, and wherein the control terminal of the Pth pull-down switch coupled to said Kth decode node is connected to the Qth pre-decode node of the Pth group of decode nodes, Q being determined by the value of the Pth digit of said L digit representation of K.

11. The decode circuit of claim 10 wherein each said routing switch comprises a field effect transistor of a first channel type and each said pull-down switch comprises a field effect transistor of the opposite channel type.

12. The decode circuit of claim 8 wherein each said radix is less than or equal to eight.

13. A dynamic decode circuit for coupling a first potential to the Kth decode node of an N decode node array, wherein K runs from 0 to N−1, and a second potential to the remaining ones of said N decode nodes, wherein N is the maximum number which may be represented by an L digit number in a number system in which the Ith digit has radix $R_I$ wherein at least one said radices is greater than two, and wherein K is represented by a binary coded number, said decode dynamic circuit comprising:

pre-decode means for converting said binary coded number to an L-digit representation thereof, said pre-decode means comprising means for coupling said binary coded number to said pre-decode means; L groups of pre-decode nodes, the Ith said group of pre-decode nodes comprising $R_I$ nodes; and means for generating and coupling a signal to one node of each said group of pre-decode nodes in response to said binary coded number, the one of said pre-decode nodes to which said signal is coupled in the Ith group of pre-decode nodes being determined by the value of the Ith digit in the L digit representation of said binary coded number;

means for coupling a clock signal to said dynamic decode circuit;

routing means coupled to said L groups of predecode nodes for coupling said Kth decode node to a first power rail at said first potential in response to the signals on said pre-decode nodes when said clock signal is present; and pull-down means coupled to said decode nodes for coupling said decode nodes to a second power rail at said second potential when said clock signal is absent.

14. The dynamic decode circuit of claim 13 wherein said routing means comprises an L level array of routing switches, each said switch comprising an input terminal, an output terminal, and a control terminal, said input terminal being electrically coupled to said output terminal in response to a signal on said control terminal, wherein the Jth level of said L level array (for J running from 2 to L) comprises $$\prod_{i=1}^{J-1} R_i$$

groups of routing switches, each said group comprising $R_J$ routing switches, the input of each routing switch in a given group of routing switches being coupled to the output of a routing switch comprising one of the routing switches in the $(J-1)$st level of said L level array, the first level of said L level array comprising $R_1$ routing switches, the input of each routing switch in said first level being coupled to said first power rail and the outout of each routing switch comprising said Lth level being coupled to a corresponding decode node, and wherein the control terminal of the Mth switch of each group of switches comprising said Jth level (for J running from 1 to L) is coupled to the Mth decode node of the Jth group of decode nodes.

15. The decode circuit of claim 14 wherein said pull-down means comprises a pull-down siitch coupled to each said decode node, each said pull-down switch comprising an input terminal, an output terminal, and a control terminal, said input terminal being electrically coupled to said output terminal in the absence of a signal on said control terminal, the output of each said switch being coupled to said second power rail, and the control terminal of each pull-down switch coupled being coupled to said clock signal coupling means.

16. The decode circuit of claim 15 wherein each said routing switch comprises a field effect transistor of a first channel type and each said pull-down switch comprises a field effect transistor of the opposite channel type.

* * * * *

UNITED STATES PATENT AND TRADEMARK OFFICE
CERTIFICATE OF CORRECTION

PATENT NO. : 4,796,227

DATED : January 3, 1989

INVENTOR(S) : Richard F. Lyon, Richard R. Schediwy

It is certified that error appears in the above-identified patent and that said Letters Patent is hereby corrected as shown below:

Column 2, line 13, delete "ttatic" and insert therefor --static--;

Column 2, line 15, delete "deooder" and insert therefor --decoder--;

Column 2, line 63, delete "binary";

Column 5, line 23, delete "srrvice" and insert therefor --service--;

Column 5, line 66, delete "toleranoes" and insert therefor --tolerances--;

Column 10, line 14, delete "purality" and insert therefor --plurality--;

Column 11, line 18, delete "river" and insert therefor --driver--;

Column 11, line 36, delete "transtion" and insert therefor --transition--;

Column 11, line 54, insert "a" between "and" and "word";

Column 11, line 57, delete "obtaiyned" and insert therefor --obtained--;

Column 13, line 9, delete "transistoss" and insert therefor --transistors--;

Column 14, line 19, delete "sigal" and insert therefor --signal--;

UNITED STATES PATENT AND TRADEMARK OFFICE
CERTIFICATE OF CORRECTION

PATENT NO. : 4,796,227

DATED : January 3, 1989

INVENTOR(S) : Richard F. Lyon, Richard R. Schediwy

It is certified that error appears in the above-identified patent and that said Letters Patent is hereby corrected as shown below:

Column 16, line 13, delete "lenghh" and insert therefor --length--;

Column 16, line 32, delete "whihh" and insert therefor --which--;

Column 20, line 35, delete "coupledt" and insert therefor --coupled--;

Column 20, line 35, delete "o" and insert therefor --to--;

Column 21, line 17, delete "BBCD" and insert therefor --BCD--;

Column 27, lines 14-15, delete "out-out" and insert therefor --out-put--;

Column 28, line 4, delete "siitch" and insert therefor --switch--.

Column 5, line 61, before "power" delete "the";

Column 6, line 40, delete "transistors" and insert therefor --transistor--;

Column 6, line 46, delete "changed" and insert therefor --change--;

Column 6, line 56, delete "sufficeint" and insert therefor --sufficient--;

Column 6, line 58, delete "undesireable" and insert therefor -- undesirable--;

UNITED STATES PATENT AND TRADEMARK OFFICE
CERTIFICATE OF CORRECTION

PATENT NO. : 4,796,227

DATED : January 3, 1989

INVENTOR(S) : Richard F. Lyon, Richard R. Schediwy

It is certified that error appears in the above-identified patent and that said Letters Patent is hereby corrected as shown below:

Column 7, line 65, after "on" delete "at";

Column 8, line 56, delete "micro ampere" and insert therefor --micro-ampere--;

Column 9, line 26, before "the" insert --to--;

Column 9, line 65, delete "bits" and insert therefor --bit--;

Column 11, line 41, delete "circuits" and insert therefor --circuit--;

Column 12, line 8, delete "possible" and insert therefor --possibly--;

Column 12, line 53, delete "drow" and insert therefor --drop--;

Column 14, line 10, delete the second occurrence of "state";

Column 15, line 18, after "by" delete "the";

Column 15, line 30, delete "then" and insert therefor --than--;

Column 17, line 18, delete "accross" and insert therefor --across--;

UNITED STATES PATENT AND TRADEMARK OFFICE
CERTIFICATE OF CORRECTION

PATENT NO. : 4,796,227

DATED : January 3, 1989

INVENTOR(S) : Richard F. Lyon, Richard R. Schediwy

It is certified that error appears in the above-identified patent and that said Letters Patent is hereby corrected as shown below:

Column 22, line 36, delete "additional" and insert therefor --addition--.

Signed and Sealed this

Tenth Day of April, 1990

Attest:

HARRY F. MANBECK, JR.

*Attesting Officer*      *Commissioner of Patents and Trademarks*